(12) United States Patent
Peng et al.

(10) Patent No.: US 12,061,856 B2
(45) Date of Patent: Aug. 13, 2024

(54) SEMICONDUCTOR DEVICE INCLUDING COMBINATION ROWS AND METHOD AND SYSTEM FOR GENERATING LAYOUT DIAGRAM OF SAME

(71) Applicant: TAIWAN SEMICONDUCTOR MANUFACTURING CO., LTD., Hsinchu (TW)

(72) Inventors: Shih-Wei Peng, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 717 days.

(21) Appl. No.: 17/023,286

(22) Filed: Sep. 16, 2020

(65) Prior Publication Data
US 2021/0240900 A1 Aug. 5, 2021

Related U.S. Application Data

(60) Provisional application No. 62/968,236, filed on Jan. 31, 2020.

(51) Int. Cl.
| | |
|---|---|
| *G06F 30/392* | (2020.01) |
| *H01L 23/522* | (2006.01) |
| *H01L 23/528* | (2006.01) |
| *H01L 27/02* | (2006.01) |
| *H01L 27/092* | (2006.01) |

(52) U.S. Cl.
CPC ........ *G06F 30/392* (2020.01); *H01L 23/5226* (2013.01); *H01L 23/5286* (2013.01); *H01L 27/0207* (2013.01); *H01L 27/092* (2013.01)

(58) Field of Classification Search
CPC ............ H01L 27/0207; H01L 27/0211; H01L 2027/11881; H01L 21/8238; H01L 27/11807; G06F 30/392
See application file for complete search history.

(56) References Cited

U.S. PATENT DOCUMENTS

| | | | | |
|---|---|---|---|---|
| 7,302,660 | B2 * | 11/2007 | Shimamura ........... | G06F 30/392 257/E27.001 |
| 7,932,566 | B2 * | 4/2011 | Hou .................. | H01L 27/11803 257/565 |
| 10,756,114 | B2 * | 8/2020 | Liaw ................... | H01L 23/5283 |
| 10,998,340 | B2 * | 5/2021 | Guo ..................... | H01L 27/0207 |
| 2019/0164949 | A1 * | 5/2019 | Sio .................... | H01L 27/11807 |

\* cited by examiner

*Primary Examiner* — Phat X Cao
*Assistant Examiner* — Diana C Vieira
(74) *Attorney, Agent, or Firm* — Hauptman Ham, LLP

(57) ABSTRACT

A method generating a layout diagram includes: arranging the layout diagram into rows; configuring one or more of the rows as combination rows, the combination-row-configuring including relative to a second direction substantially perpendicular to the first direction, setting a height of each of the one or more combination rows to be substantially equal to a sum of a first height of a first cell and a second height of a second cell, the first cell being different than the second cell, and the first height being different than the second height; and populating each of the one or more combination rows including: stacking a first instance of the first cell on a first instance of the second cell, or stacking a second instance of the second cell on a second instance of the first cell.

20 Claims, 22 Drawing Sheets

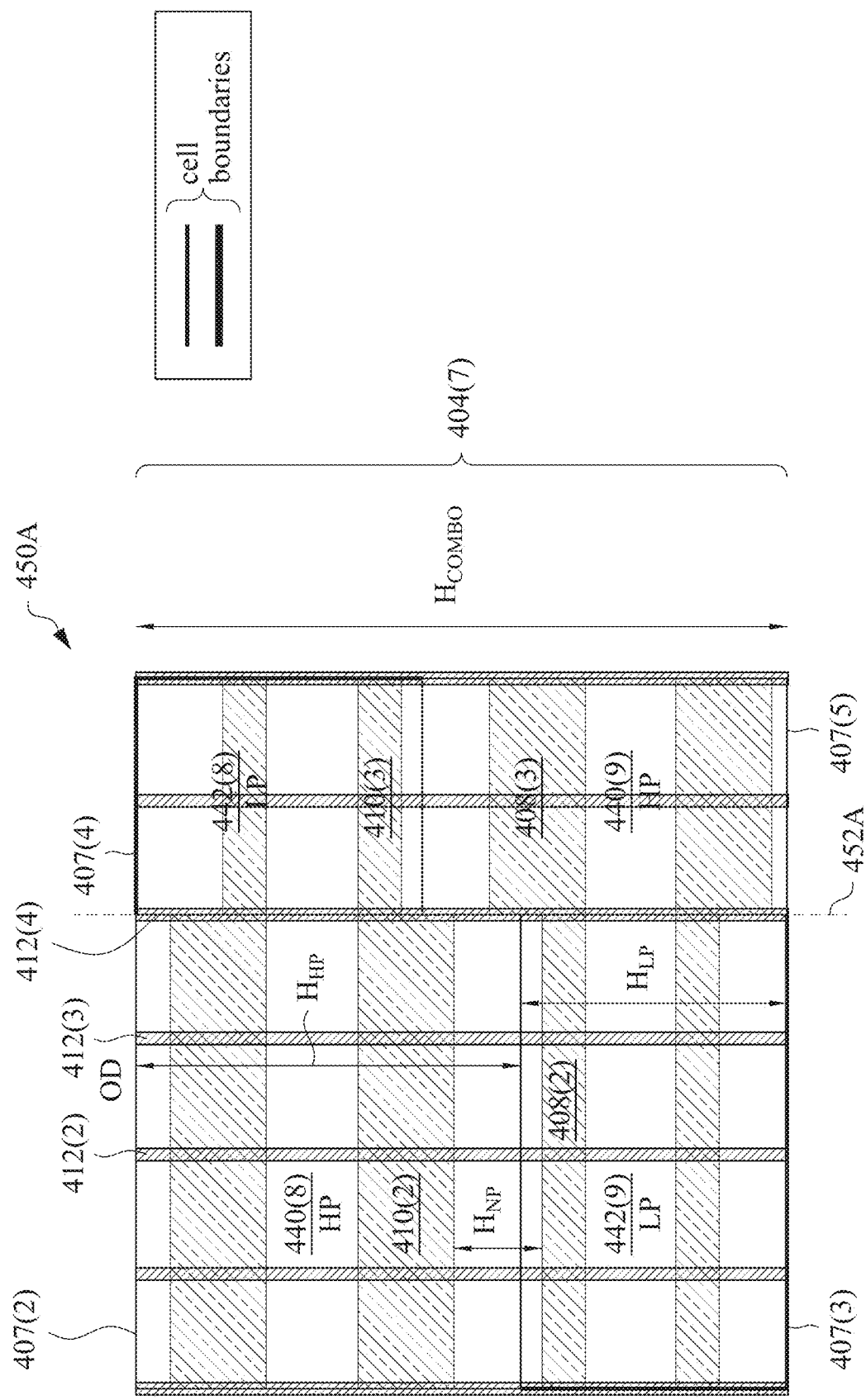

SEMICONDUCTOR DEVICE INCLUDING COMBINATION ROWS AND METHOD AND SYSTEM FOR GENERATING LAYOUT DIAGRAM OF SAME

PRIORITY CLAIM

The present application claims the priority of U.S. Provisional Application No. 62/968,236, filed Jan. 31, 2020, which is incorporated herein by reference in its entirety.

BACKGROUND

An integrated circuit ("IC") includes one or more semiconductor devices. One way in which to represent a semiconductor device is with a plan view diagram referred to as a layout diagram. Layout diagrams are generated in a context of design rules. A set of design rules imposes constraints on the placement of corresponding patterns in a layout diagram, e.g., geographic/spatial restrictions, connectivity restrictions, or the like. Often, a set of design rules includes a subset of design rules pertaining to the spacing and other interactions between patterns in adjacent or abutting cells where the patterns represent conductors in a layer of metallization.

Typically, a set of design rules is specific to a process node by which will be fabricated a semiconductor device based on a layout diagram resulting. The design rule set compensates for variability of the corresponding process node. Such compensation increases the likelihood that an actual semiconductor device resulting from a layout diagram will be an acceptable counterpart to the virtual device on which the layout diagram is based.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 4A-4F are corresponding layout diagrams, in accordance with some embodiments.

DETAILED DESCRIPTION

Figure 1:
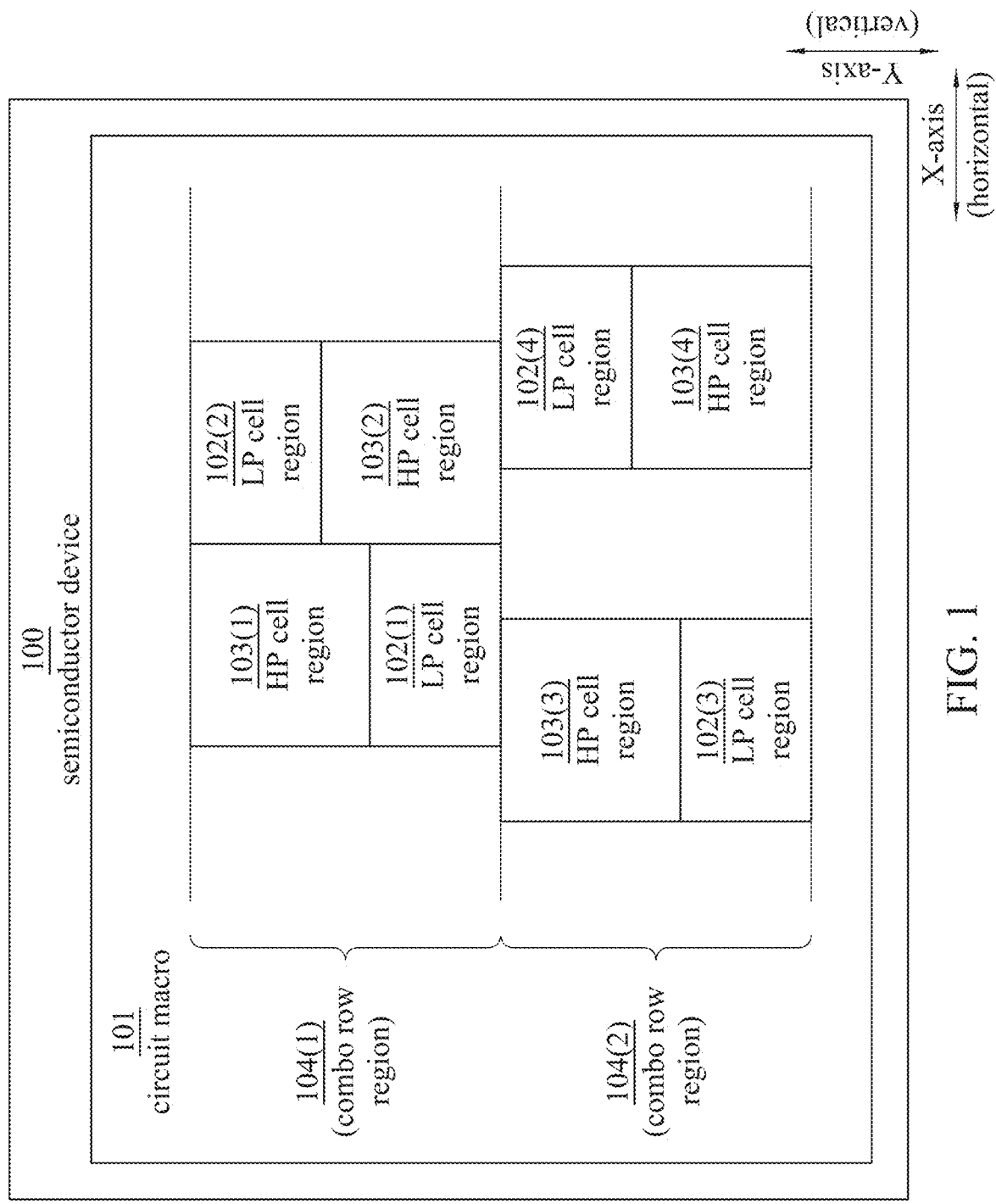
FIG. 1 is a block diagram of a semiconductor device, in accordance with at least one embodiment of the present disclosure.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a method of generating a layout diagram includes arranging the layout diagram into rows, and configuring first and second cells for the rows including: generating conductive patterns for a first metallization level (M_1st level); setting a first pitch as a sole pitch for the M_1st level; generating conductive patterns for a third metallization level (M_3rd level) including conductive patterns for a power grid (PG patterns) and conductive patterns for control or data signals (logic patterns); and setting multiple pitches for the M_3rd level, the multiple pitches including a second pitch for logic patterns, and a third pitch for PG patterns, the third pitch being greater than the second pitch. In some embodiments, the M_1st level is sole-pitch and the M_3rd level is multi-pitch. According to another approach, multiple pitches are set for the M_1st level including a first pitch for logic patterns and a greater second pitch for PG patterns, and a third pitch is set as a sole pitch for the M_3rd level. According to the other approach (in which the M_1st level is multi-pitch, and the M_3rd level is sole-pitch), the height a of given row in a layout diagram is set to accommodate only high power (HP) cells of a first height ($H_{HP}$) or only low power (LP) cells of a second height ($H_{LP}$), where the second height is less than the first height.

According to some embodiments, having the M_1st level be sole-pitch and the M_3rd level be multi-pitch facilitates the use of a combination row which is populated with at least a first stack having an HP cell over an LP cell (an HP/LP stack) or at least second stack having an LP cell over an HP cell (an LP/HP stack). The combination row is configured with a height ($H_{COMBO}$) substantially equal to a sum of a first height ($H_{HP}$) of an HP cell and a second height ($H_{LP}$) of an LP cell, where $H_{LP}<H_{HP}$, and such that $H_{HP}=H_{LP}+H_{HP}$. As compared to the other approach, the use of combination rows facilitates the swapping of locations of HP cells and LP cells and thereby facilitates more efficient placement of HP cells and LP cells, e.g. which results in layout diagrams which consume smaller areas.

In some embodiments, a semiconductor device includes: cell regions arranged in rows with one or more of the rows being combination rows. Each combination row has: a height substantially equal to a sum of a first height of a first cell region and a second height of a second cell region, the first cell region being different than the second cell region, and the first height being different than the second height. Each of the one or more combination rows includes: a first instance of the first cell region stacked on a first instance of the second cell region, or a second instance of the second cell region stacked on a second instance of the first cell region.

FIG. 1 is a block diagram of a semiconductor device 100A, in accordance with at least one embodiment of the present disclosure.

In FIG. 1, semiconductor device 100 includes, among other things, a circuit macro (hereinafter, macro) 101. In some embodiments, macro 101 is an SRAM macro. In some embodiments, macro 101 is a macro other than an SRAM macro. Macro 101 includes, among other things, combination (combo) row regions 104(1) and 104(2), each of which is sized to have a height (relative to the Y-axis) which accommodates an HP cell region stacked on an LP cell region, or vice-versa.

More particularly, relative to a first direction, which is the Y-axis in FIG. 1, row region 104(1) includes HP cell region 103(1) stacked on LP cell region 102(1) which represents an HP/LP stack, and LP cell region 102(2) stacked on HP cell region 103(2) which represents an LP/HP stack. Relative to a second direction substantially perpendicular to Y-axis, which is the X-axis in FIG. 1, HP cell region 103(1) is substantially aligned over LP cell region 102(1), LP cell region 102(2) is substantially aligned over HP cell region 103(2). Also, relative to the Y-axis, row region 104(2) includes HP cell region 103(3) stacked on LP cell region 102(3) which represents another HP/LP stack, and LP cell region 102(4) stacked on HP cell region 103(4) which represents another LP/HP stack. Relative to the X-axis, HP cell region 103(3) is substantially aligned over LP cell region 102(3), and LP cell region 102(4) is substantially aligned over HP cell region 103(4).

In row region 104(1), relative to the X-axis, the HP/LP stack of HP cell region 103(1) over LP cell region 102(1) substantially abuts the LP/HP stack of LP cell region 102(2) over HP cell region 103(2). By contrast, in row region 104(2), relative to the X-axis, the HP/LP stack of HP cell region 103(3) over LP cell region 102(3) is substantially separated from the LP/HP stack of LP cell region 102(4) over HP cell region 103(4). In some embodiments, the first and second directions are directions other than the corresponding Y-axis and X-axis. Example layout diagrams resulting in combo row region 104 include the layout diagrams disclosed herein.

Figure 2A:
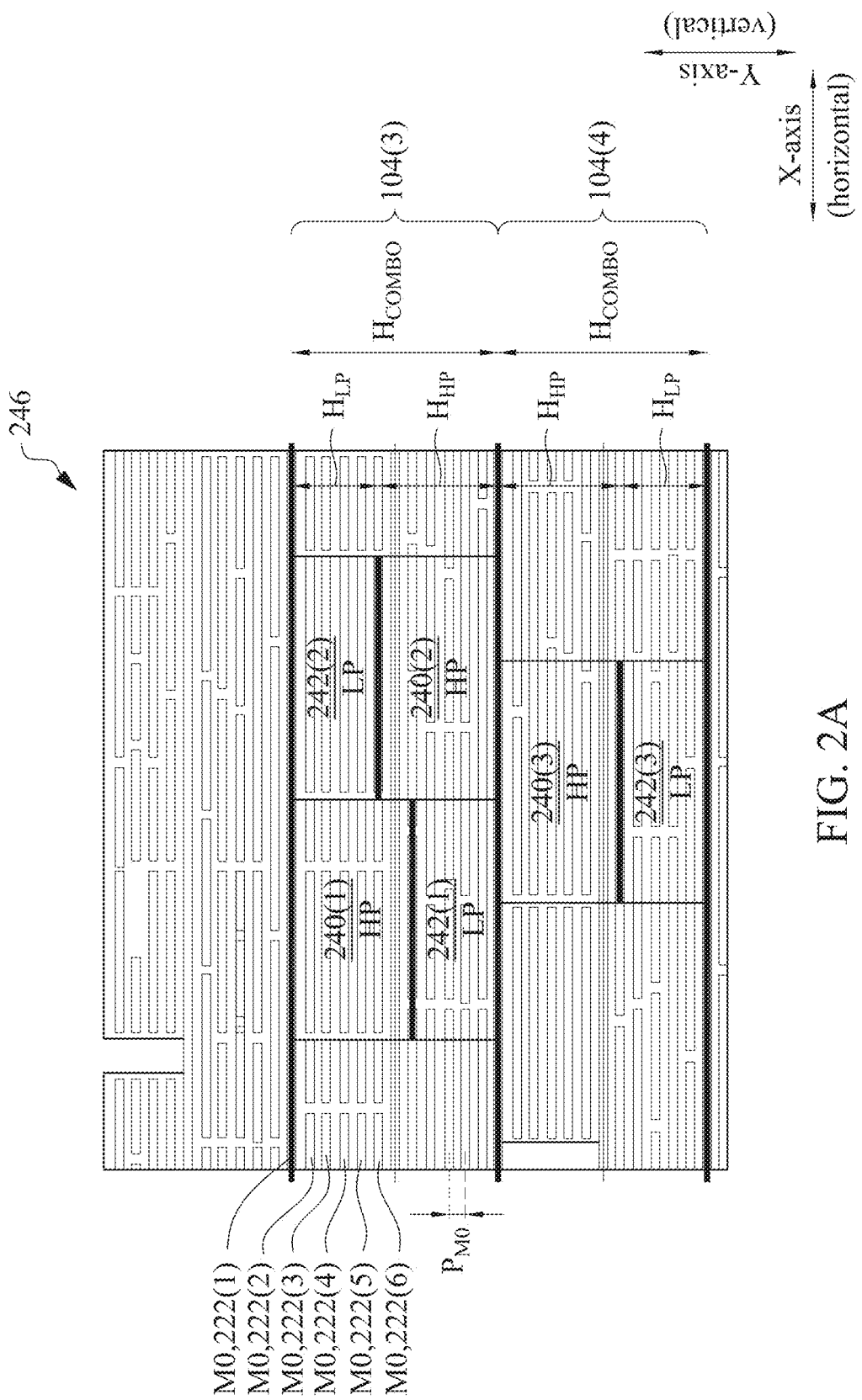
FIG. 2A is a layout diagram, in accordance with some embodiments.

FIG. 2A is a layout diagram 246, in accordance with some embodiments.

In FIG. 2A, layout diagram 246 is arranged into rows which extend substantially in a first direction. In some embodiments, the first direction is substantially parallel to the X-axis. Some of the rows are configured as combination rows (combo rows), e.g., 104(3) and 104(4).

Layout diagram 246 includes conductive patterns for a first metallization level (M_1st level). Here, it will be assumed that the numbering convention of the corresponding design rules of the corresponding semiconductor process technology node begins with a first metallization level (M_1st level) and a first interconnection level (VIA_1st level) being referred to correspondingly as M0 and VIA0. In some embodiments, the numbering convention begins with the M_1st level and the V_1st level being referred to correspondingly as M1 and VIA1. In FIG. 2A, for ease of illustration, only a few of the conductive patterns in level M0 have been provided with callout numbers, namely 222(1), 222(2), 222(3), 222(4), 222(5) and 222(6). For the M0 level, a first pitch ($P_{M0}$) is set as a sole pitch for conductive patterns in the M0 level. In some embodiments, a pitch for adjacent first and second patterns is measured from a centerline of the first pattern to a centerline of the second pattern.

Relative to a second direction substantially perpendicular to the first direction, where the second direction is the Y-axis in FIG. 2A, combo row 104(3) includes: a stack having a high power (HP) cell 240(1) over a low power (LP) cell 242(1), which represents an HP/LP stack; and a stack having LP cell 242(2) over HP cell 240(2), which represents an LP/HP stack. In combo row 104(3), relative to the X-axis, the HP/LP stack including HP cell 240-(1) over LP cell 242(1) substantially abuts the LP/PH stack including LP cell 242(2) over HP cell 240(2). Relative to the Y-axis, combo row 104(4) includes an HP/LP stack having HP cell 240(3) over LP cell 242(3).

In FIG. 2A, a height (HCOMBO) of each of combo rows 104(3) and 104(4) is substantially equal to a sum of a first height ($H_{HP}$) of an HP cell, e.g., HP cell 240(2), and a second height ($H_{LP}$) of an LP cell, e.g., LP cell 242(2), where $H_{LP}<H_{HP}$, and such that $H_{HP}=H_{LP}+H_{HP}$. In some embodiments, the first and second directions are directions other than the corresponding Y-axis and X-axis. In some embodiments, $H_{HP}$ is in a range ($\approx 5*P_{M0}$)$\leq H_{HP}\leq$($\approx 10*P_{M0}$). In some embodiments, $H_{LP}$ is in a range: ($\approx 3*P_{M0}$)$\leq H_{HP}\leq$ ($\approx 4*P_{M0}$).

Figure 2B:
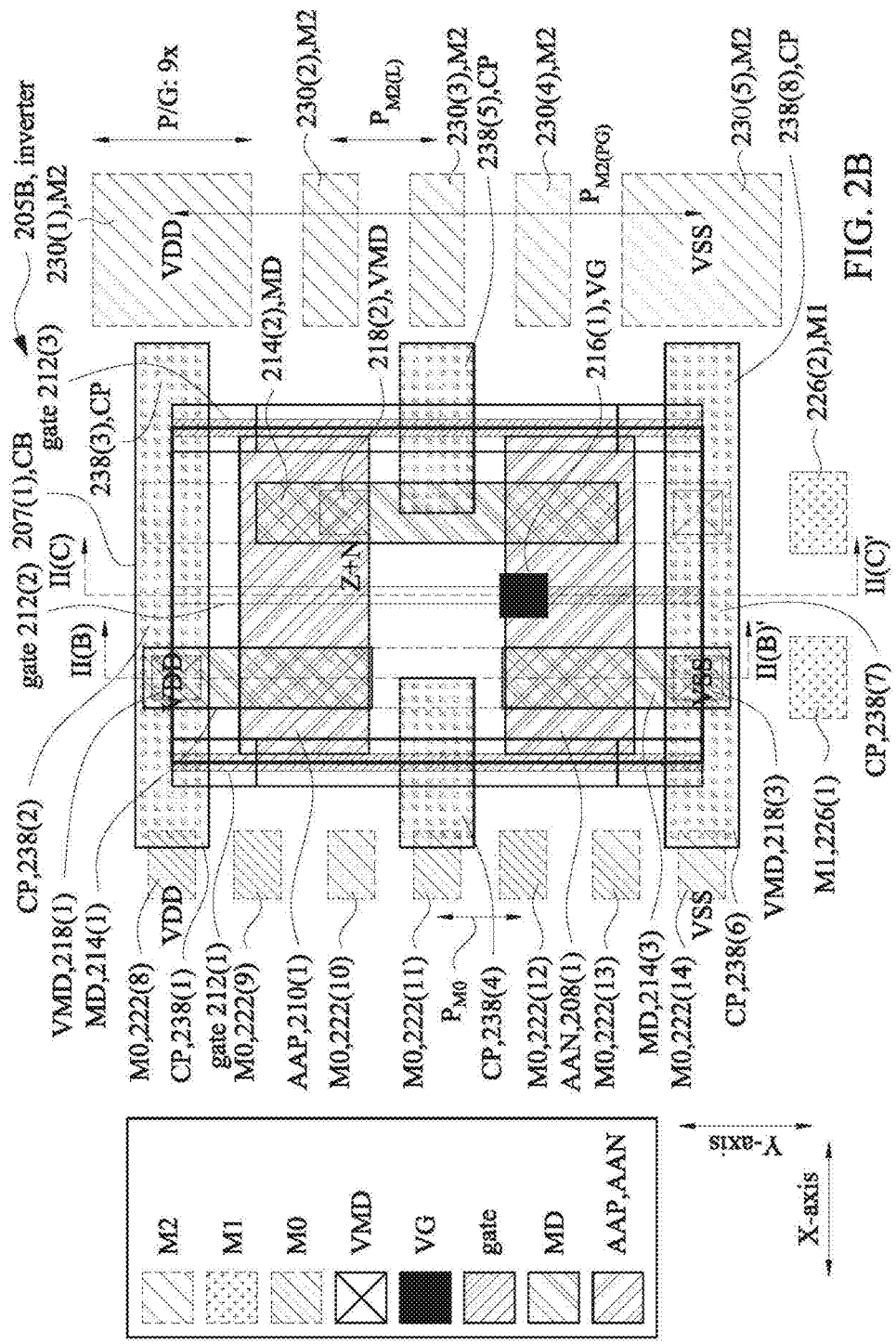
FIG. 2B is a layout diagram, in accordance with some embodiments.
Figure 2C:
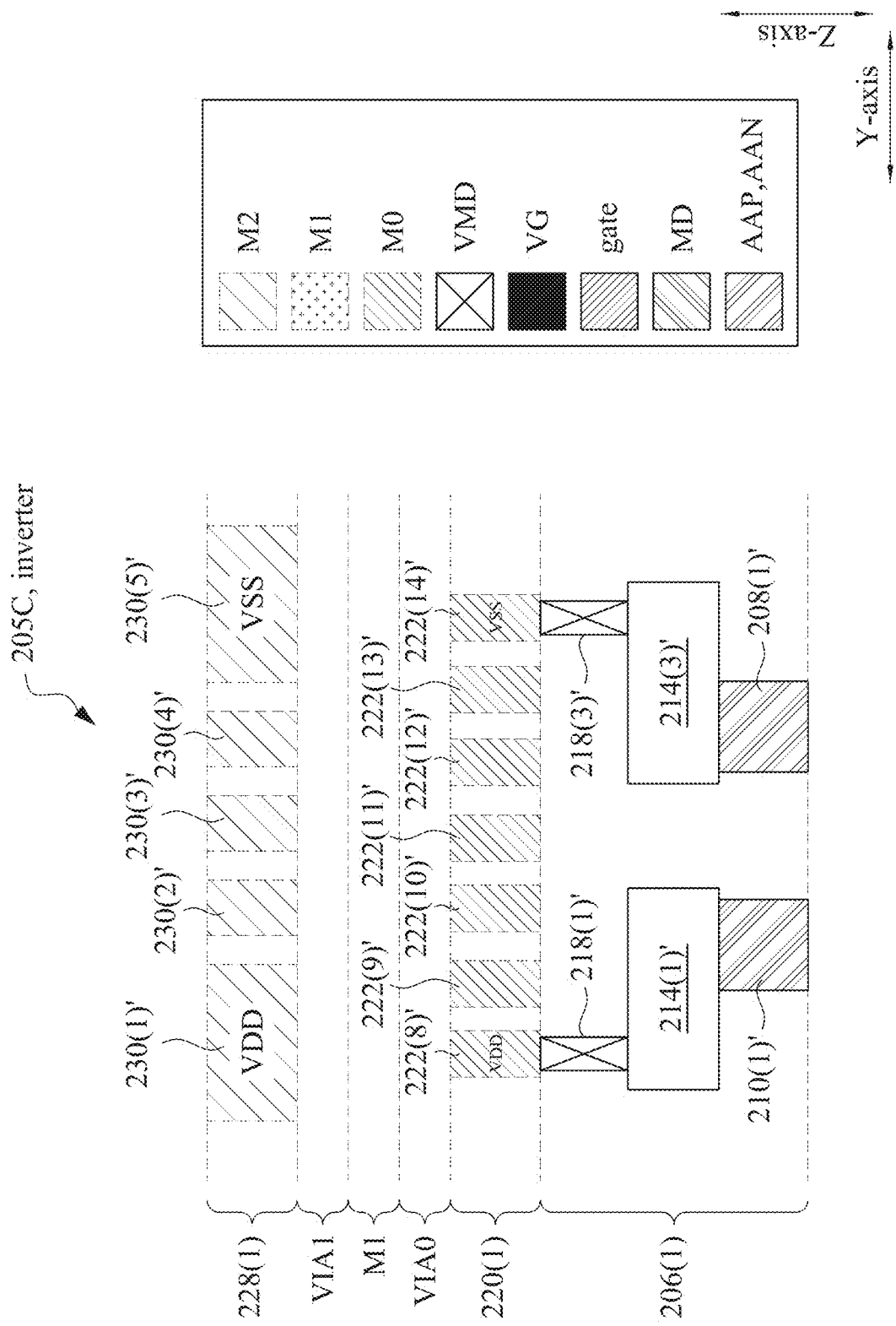
FIGS. 2C-2D are corresponding cross sectional views, in accordance with some embodiments.
Figure 2D:
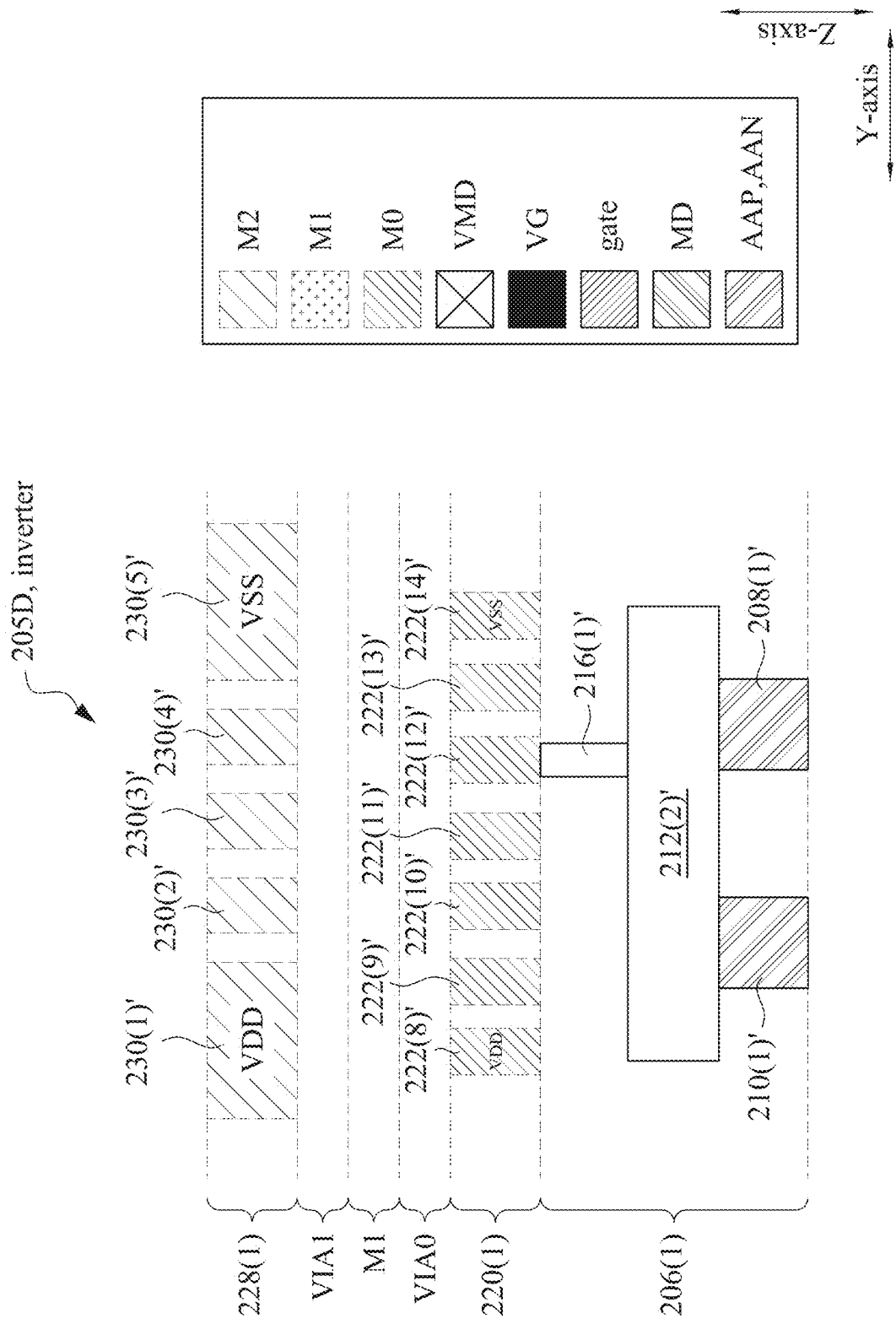

FIG. 2B is a layout diagram 205B of an inverter, in accordance with some embodiments. FIGS. 2C-2D are corresponding cross sectional views 205C-205D, in accordance with some embodiments.

Layout diagram 205B of FIG. 2B and cross-sections 205C and 205D of corresponding FIGS. 2C-2D follow a numbering convention similar to that of layout diagram 2146 of FIG. 2S. To help identify components which correspond but nevertheless have differences, the numbering convention of FIGS. 2B-2D uses parentheticals. Furthermore, the numbering convention of FIGS. 2C-2D appends an apostrophe to an element number to indicate a structure corresponding to an otherwise like-numbered pattern in FIG. 2B. For brevity, the discussion will focus more on differences between FIGS. 2B-2D and FIG. 2A than on similarities.

In FIG. 2B, the inverter of layout diagram 205B has a cell boundary (CB) 207(1). Layout diagram 205B includes: active area (AA) pattern 208(1) designated for NMOS configuration, which corresponds to an active region (AR) having NMOS configuration (ARN region) 208(1)' of FIGS. 2C-2D, and hereinafter referred to as AAR pattern 208(1); and AA pattern 210(1) designated for PMOS configuration, which corresponds to an active region (AR) having PMOS configuration (ARP region) 210(1)' of FIGS. 2C-2D, and hereinafter referred to as AAP pattern 210(1); gate patterns 212(1), 212(2) and 212(3) over AAN 208(1) and AAP 210(1) and corresponding to gate structures 212(1)', 212(2)' and 212(3)' in FIGS. 2C-2D.

Layout diagram 205B further includes: metal-over drain (MD) contact pattern (MD pattern) 214(1) over AAP pattern 210(1), which corresponds to MD contact structure 214(1)' in FIG. 2C; MD pattern 214(2) over AAP pattern 210(1) and AAN pattern 208(1); MD pattern 214(3) over AAN pattern 208(1), which corresponds to MD contact structure 214(3)' in FIG. 2C; gate patterns 212(1), 212(2) and 212(3), each of which correspondingly overlies AAP pattern 210(1) and AAN pattern 208(1), where gate pattern 212(2) corresponds to gate structure 212(2)' in FIG. 2D; MD-to-M0 via (VMD) patterns 218(1), 218(2) and 218(3) corresponding over MD patterns 214(1), 214(2) and 214(3), where VMD patterns 218(1) and 218(3) correspond to MD contact structures 218(1)' and 218(3)' in FIG. 2C; and gate-to-M0 via (VG) pattern 216(1) over gate pattern 212(2), which corresponds to VG structure 216(1)' in FIG. 2D.

In FIG. 2B, layout diagram 205B further includes: cut patterns (CP patterns) 238(1), 238(2), 238(3), 238(4), 238(5), 238(6), 238(7) and 238(8) over corresponding gate patterns 212(1)-212(3); phantom M0 conductive patterns (M0 patterns) 222(8), 222(9), 222(10), 222(11), 222(12), 222(13) and 222(14) in the M0 level, which correspond to phantom M0 conductive segments 222(8)', 222(9)', 222(10)', 222(11)', 222(12)', 222(13') and 222(14)' in M0 layer 220 of FIGS. 2C-2D; phantom M1 conductive segments 226(1) and 226(2); and phantom M2 conductive patterns (M2 patterns) 230(1), 230(2), 230(3), 230(4) and 230(5) in a third level of metallization (M_3rd level), where the M_3rd level is M2 in FIG. 2B, and which correspond to phantom M2 conductive segments 230(1)', 230(2)', 230(3)', 230(4)' and 230(5)' in M2 layer 228 of FIGS. 2C-2D. A CP pattern overlies a corresponding gate pattern and indicates that an underlying portion of the gate pattern will be cut/removed. In some embodiments, relative the Y-axis, each of M2 PG patterns 230(1) and 230(5) has a height of 9x, where x is a unit of distance (length) measure. In some embodiments, x=4 nm. Relative to the Y-axis, a width of the M2 PG patterns, e.g., M2 PG pattern 330(9) is in a range ($\approx 2*W_{M2(L)}$)$\leq P_{M2} \leq$ ($\approx 3.5*W_{M2(L)}$), where $W_{M2(L)}$ is a width of an M2 logic pattern.

Long axes of AAN pattern 208(1), AAP pattern 210(1), M0 patterns 222(9)-222(14) and M2 patterns 230(1)-230(5) and CP patterns 238(1)-238(8) extend substantially parallel to the X-axis. Long axes of gate patterns 212(1)-212(3) and MD patterns 214(1)-214(3) extend substantially parallel to the Y-axis.

Phantom M0 patterns 222(8)-222(14), phantom M1 patterns 226(1)-226(2) and phantom M2 patterns 230(1)-230(5) are referred to as phantom because they are optional as indicated by the phantom (dashed) outlines. Phantom M0 patterns 222(8)-222(14) are included, e.g., to show that the M0 level has a first pitch ($P_{M0}$) as the sole pitch for conductive patterns in the M0 level. In some embodiments, $P_{M0}$ is in a range ($\approx 0.2*H_{CELL}$)$\leq P_{M0} \leq$($\approx 0.25*H_{CELL}$), where $H_{CELL}$, e.g., is a height of a representative cell. In some embodiments, $H_{CELL}=H_{HP}+H_{LP}$. In some embodiments, $H_{CELL}=H_{HP}$. In some embodiments, $H_{CELL}=H_{LP}$.

Phantom M0 patterns 222(8) and 222(14) are power grid (PG) patterns (MM PG patterns). In some embodiments, M0 PG pattern 222(8) is designated for a first reference voltage, e.g., VDD. In some embodiments, M0 PG pattern 222(14) is designated for a second reference voltage, e.g., VSS. In some embodiments, M0 PG patterns 222(8) and 222(14) are designated for corresponding first and second reference voltages other than correspondingly VDD and VSS.

Phantom M0 patterns 222(9)-222(13) are logic patterns, e.g., for data signals or control signals. Phantom M0 patterns 222(9)-222(13) are included, e.g., to show that the M0 level has a sole pitch ($P_{M0}$) for M0 PG patterns 222(8) and 222(14) as well as for phantom M0 logic patterns 222(9)-222(13). Phantom M1 patterns 226(1)-226(2) are included, e.g., to establish context for phantom patterns M0 patterns 222(8)-222(14) and phantom M2 patterns 230(1)-230(5). Phantom M2 patterns 230(1) and 230(5) are power grid (PG) patterns (M2 PG patterns). In some embodiments, M2 PG pattern 230(1) is designated for a first reference voltage, e.g., VDD. In some embodiments, M2 PG pattern 230(5) is designated for a second reference voltage, e.g., VSS. In some embodiments, M2 PG patterns 230(1) and 230(5) are designated for corresponding first and second reference voltages other than correspondingly VDD and VSS. Phantom M2 patterns 230(2)-230(4) are logic patterns, e.g., for data signals or control signals. Phantom M2 patterns 230(1)-230(5) are included, e.g., to show that the M2 level is multi-pitch and includes: a first a pitch ($P_{M2(PG)}$) for phantom M2 PG patterns 230(1) and 230(5); and a second pitch ($P_{M2(L)}$) for phantom M2 logic patterns 230(2)-230(4).

In FIGS. 2C-2D, ARP region 210(1)', ARN region 208(1), MD contact structures 214(1)' and 214(3)', gate structure 212(2)', MD contact structures 218(1)' and 218(2)' and VG structure 216(1)' as shown as being included in a transistor layer 206(1). ARP region 210(1)' represents an active region (AR) having PMOS configuration and corresponds to AAP 210(1) of FIG. 2B. ARN region 208(1)' represents an AR having NMOS configuration, and corresponds to AAN 208(1) of FIG. 2B. Also in FIGS. 2C-2D, relative to the Z-axis, there is a gap between M0 layer 220(1) and M2 layer 228(1). The gap includes: a first layer VIA0 of via structures (not shown) over M0 layer 220(1); a second layer of metallization (M_2nd), which is M1 in FIGS. 2C-2D, over layer VIA0; and a second layer VIA1 of via structures (not shown) over the M1 layer.

Figure 3A:
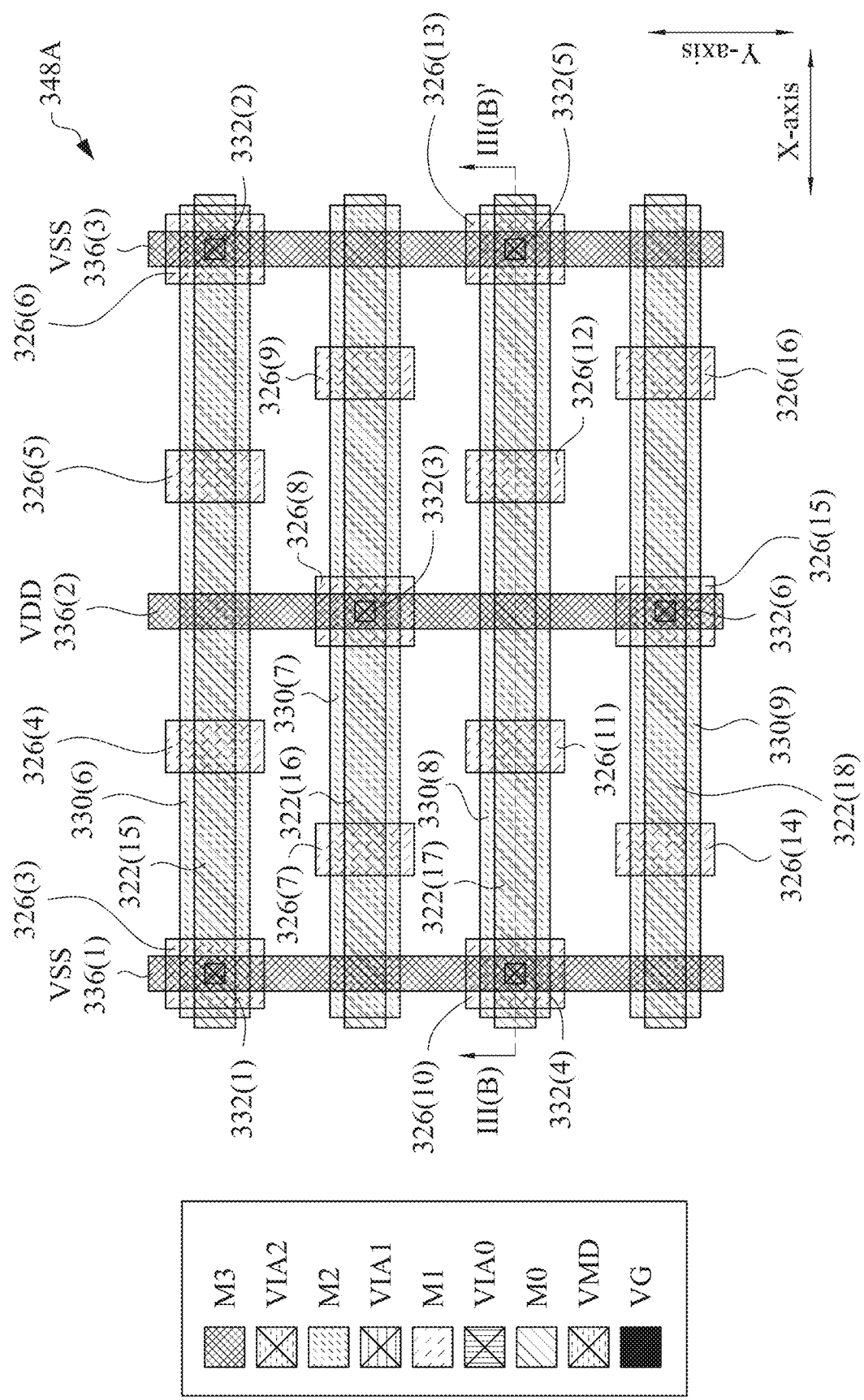
FIG. 3A is a layout diagram, in accordance with some embodiments.
Figure 3B:
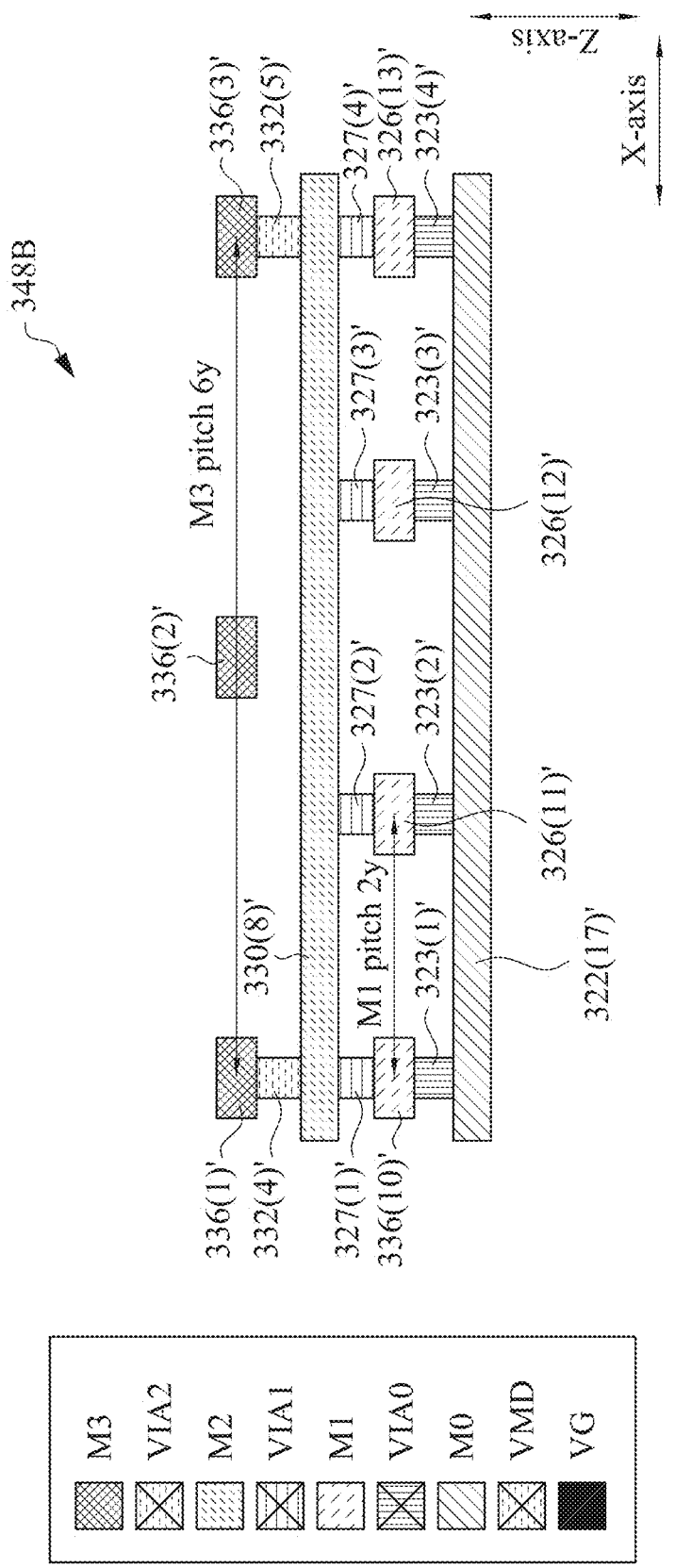
FIG. 3B is a cross sectional view, in accordance with some embodiments.
Figure 3C:
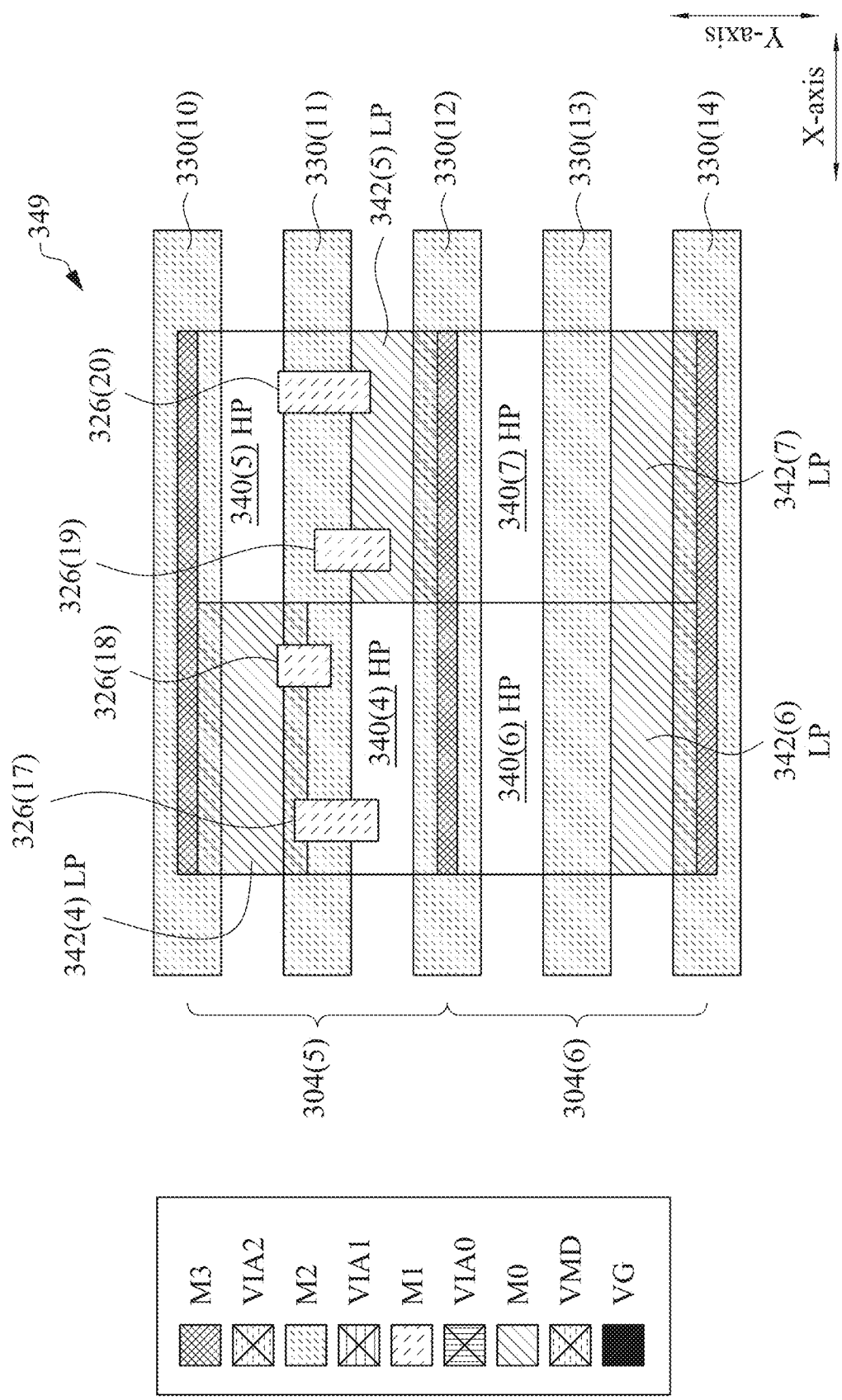
FIG. 3C is a layout diagram, in accordance with some embodiments.

FIG. 3A is a layout diagram 348A, in accordance with some embodiments. FIG. 3B is a cross sectional view 348B, in accordance with some embodiments. FIG. 3C is a layout diagram 349, in accordance with some embodiments.

Layout diagram 348A of FIG. 3A, cross-section 304B of FIG. 3B and layout diagram 349 of FIG. 3C follow a numbering convention similar to that of FIGS. 2A-2D. To help identify components which correspond but nevertheless have differences, the numbering convention of FIGS. 3A-3C uses 3-series numbers whereas FIGS. 2A-2D use 2-series numbers. For brevity, the discussion will focus more on differences between FIGS. 3A-3C and FIGS. 2A-2D than on similarities.

In FIG. 3A, layout diagram 348A includes: M0 conductive patterns in the M0 level (M0 patterns) 322(15), 322(16), 322(17) and 322(18), of which M0 pattern 322(17) corresponds to M0 conductive segment 322(17)' in the M0 layer of FIG. 3B; M1 conductive patterns in the M1 level (M1 patterns) 326(3), 326(4), 326(5), 326(6), 326(7), 326(8), 326(9), 326(10), 326(11), 326(12), 326(13), 326(14), 326(15) and 326(16), and correspondingly over M0 patterns 322(15)-322(18), of which M1 patterns 316(10)-326(13) correspond to M1 conductive segments 316(10)', 316(11)', 316(12)' and 316(13)' in the M1 layer of FIG. 3B; M2 conductive patterns in the M2 level (M2 patterns) 330(6), 330(7), 330(8) and 330(9), correspondingly over M1 patterns 326(3)-326(16), and correspondingly aligned over M0 patterns 322(15)-322(18), of which M2 pattern 330(8) corresponds to M2 conductive segment 330(8)' in the M2 layer of FIG. 3B; M3 conductive patterns in the M3 level (M3 patterns) 336(1), 336(2) and 336(3) over correspondingly over M2 patterns 330(6)-330(10), and correspondingly aligned over M1 patterns 326(3) & 326(10), 326(8) & 326(15), and 326(6) & 326(13), and which correspond to M3 conductive segments 336(1)', 336(2)' and 336(3)' in the M3 layer of FIG. 3B; and via patterns in a VIA2 level between the M2 level and the M3 level (V2 patterns) 332(1), 332(2), 332(3), 332(4), 332(5) and 332(6).

In some embodiments, relative the X-axis, a pitch of the M1 patterns, e.g., a pitch between M1 patterns 326(15) and 326(16), is in a range ($\approx$0.5CPP)$\leq P_{M1} \leq$($\approx$CPP), where CPP is a contacted poly pitch of a corresponding semiconductor process technology node. In some embodiments, the M2 level is multi-pitch so as to include PG patterns 330(6)-330(9) and logic patterns (not shown). In some embodiments, relative the Y-axis, a pitch of the M2 PG patterns, e.g., a pitch between M2 patterns 330(8) and 330(9), is in a range ($\approx H_{CELL}$)$\leq P_{M2(PG)} \leq$($\approx 2*H_{CELL}$), where $H_{CELL}$ represents cell height. In some embodiments, $H_{CELL}=H_{HP}$. In some embodiments, $H_{CELL}=H_{LP}$. In some embodiments, $H_{CELL}=H_{COMBO}$. In some embodiments, M2 logic patterns (not shown) have a pitch which is in a range ($\approx$0.2CPP)$\leq P_{M2(L)} \leq$($\approx$0.25CPP). In some embodiments, the M3 level is multi-pitch so as to include PG patterns 336(1)-336(3) and logic patterns (not shown). In some embodiments, relative the X-axis, a pitch of the M3 PG segments, e.g., a pitch between M3 segments 336(1)' and 336(3)', is 6y, where y is a unit of distance (length) measure. In some embodiments, y=2CPP. In some embodiments, relative to the Y-axis, each of M3 patterns 336(1)-336(3) has a length ($L_{336}$) that is equal to less than the Blech length, $L_{Blech}$. It is noted that $L_{Blech}$ represents a length of conductor below which substantially no electromigration occurs. In some embodiments, relative to a length ($L_{326}$) of M1 patterns 326(3)-326(16), $L_{336}$ is in a range ($\approx 2*L_{326}$)$\leq L_{336} \leq$($\approx 3*L_{326}$).

Layout diagram further includes (but does not show): via patterns in a VIA0 level between the M0 level and the M1 level (V0 patterns), some of which correspond to V0 structures 323(1)', 323(2)', 323(3)' and 323(4)' in the VIA0 layer of FIG. 3B; and via patterns in a VIA1 level between the M1 level and the M2 level (V1 patterns), some of which correspond to V1 structures 327(1)', 327(2)', 327(3)' and 327(4)' in the VIA1 layer of FIG. 3B.

In FIG. 3A, relative to the Y-axis, M1 patterns 326(3)-326(16) are the substantially the same height. This reflects an assumption in FIG. 3A that HP/LP and/or LP/HP stacks have not yet been inserted into corresponding combo rows (not shown in FIG. 3A). Once HP/LP and/or LP/HP stacks are inserted into corresponding combo rows, the heights of the corresponding M1 patterns then vary (see FIG. 3C).

FIG. 3C is a layout diagram 349, in accordance with some embodiments.

In some respects, layout diagram 349 of FIG. 3C is a simplified version of layout diagram 348A of FIG. 3A.

In FIG. 3C, layout diagram 349 includes: M1 conductive patterns in the M1 level (M1 patterns) 326(17), 326(18), 326(19) and 326(20); and M2 conductive patterns in the M2 level (M2 patterns) 330(10), 330(11), 330(2), 330(13) and 330(14).

Relative to the Y-axis, M1 patterns 326(17)-326(20) are correspondingly different heights. This reflects that HP/LP and/or LP/HP stacks are inserted into corresponding combo rows 304(5) and 304(6). In particular, combo row 304(5) includes: an LP/HP stack having an LP cell 342(4) over an HP cell 340(4); and an HP/LP stack having an HP cell 340(5) over an LP cell 342(5). Combo row 304(6) includes: an HP/LP stack having an HP cell 340(6) over an LP cell 342(6); and an LP/HP stack having an LP cell 342(7) over an HP cell 340(7).

Within a given combo row, relative to the Y-axis, a location of a boundary between an HP cell and an LP cell in an HP/LP cell will be different than a location of a boundary between an LP cell and an HP cell in an LP/HP cell. This difference in boundary locations causes M1 patterns 326(17)-326(20) to have correspondingly different heights.

FIGS. 4A-4F are corresponding layout diagrams 450A-450F, in accordance with some embodiments.

Layout diagrams 450A-450F of corresponding FIGS. 4A-4F follow a numbering convention similar to that of FIGS. 3A-3C. To help identify components which correspond but nevertheless have differences, the numbering convention of FIGS. 4A-4F uses 4-series numbers whereas FIGS. 3A-3C uses 3-series numbers. For brevity, the discussion will focus more on differences between FIGS. 4A-4F and FIGS. 3A-3C than on similarities. Also for brevity, fewer than all elements of FIGS. 4A-4F are numbered.

In FIG. 4A, layout diagram 450A includes a combo row 404(7). Combo row 404(7) includes: an HP/LP stack having a HP cell 440(8) with a cell boundary 407(2) over an LP cell 442(9) with a cell boundary 407(3); and an LP/HP stack having an LP cell 442(8) with a cell boundary 407(4) over an HP cell 440(9) with a cell boundary 407(5). HP cell 440(8) includes AA patterns of which AAP pattern 410(2) is called out. LP cell 442(8) includes AA patterns of which AAP pattern 410(3) is called out. LP cell 442(9) includes AA patterns of which AAN pattern 408(2) is called out. HP cell 408(3) includes AA patterns of which AAN pattern 408(3) is called out. Relative to the Y-axis, a distance $H_{NP}$ separates AAP pattern 410(2) from AAN pattern 408(2), and likewise separates AAP pattern 410(3) from AAN pattern 408(3). In some embodiments, $H_{NP}$ is in a range ($\approx 0.25*H_{LP}$)$\leq H_{NP} \leq$($\approx 0.35*H_{LP}$).

Layout diagram 450A includes gate patterns of which gate patterns 412(2), 412(3) and 412(4) are called out. Gate pattern 412(4) is substantially parallel with a reference line 452A. Relative to the X-axis: the right edges of HP cell 440(8) and LP cell 442(9) abut reference line 452A; and the left edges of LP cell 442(8) and HP cell 440(9) abut reference line 452A.

Figure 4B:
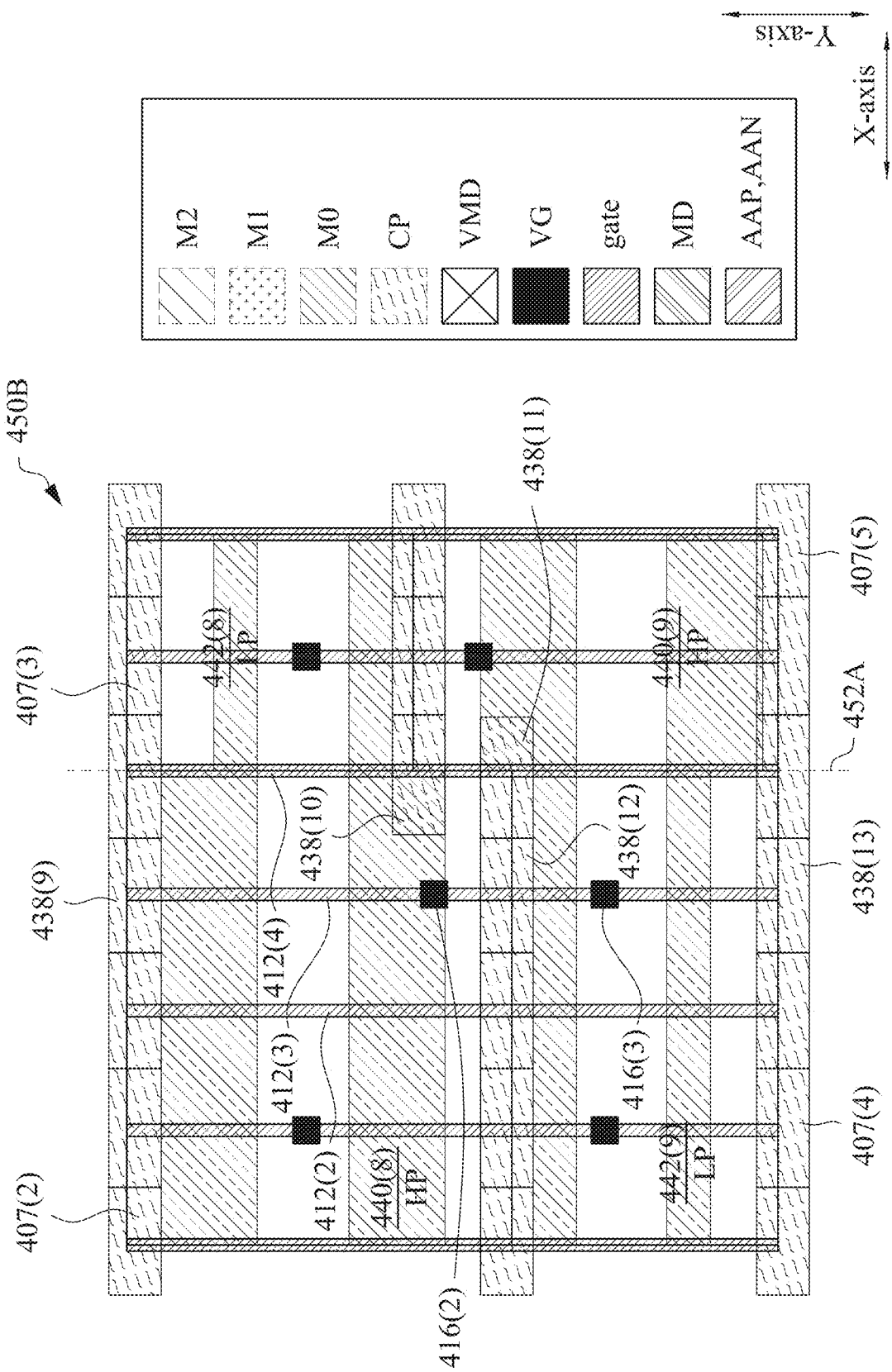

In FIG. 4B, layout diagram 450B is a variation of layout diagram 450A of FIG. 4A to which CP patterns and VG patterns have been added. Layout diagram 450B includes: VG patterns of which VG patterns 416(2) and 416(3) are called out, and where VG patterns 416(2) and 416(3) overlie corresponding portions of gate pattern 412(3); CP patterns of which CP patterns 438(9), 438(10), 438(11), 438(12) and 438(13) are called out, and where CP patterns 438(9) and 438(13) overlie corresponding ends of gate pattern 412(3), and where CP patterns 438(10 and 438(11) overlie corresponding interior portions of gate pattern 412(4). Relative to the Y-axis, CP pattern 438(10) overlies a portion of the boundary between LP cell 442(8) and HP cell 440(9). Relative to the Y-axis, CP pattern 438(11) overlies a portion of the boundary between HP cell 440(8) and LP cell 442(9).

Figure 4C:
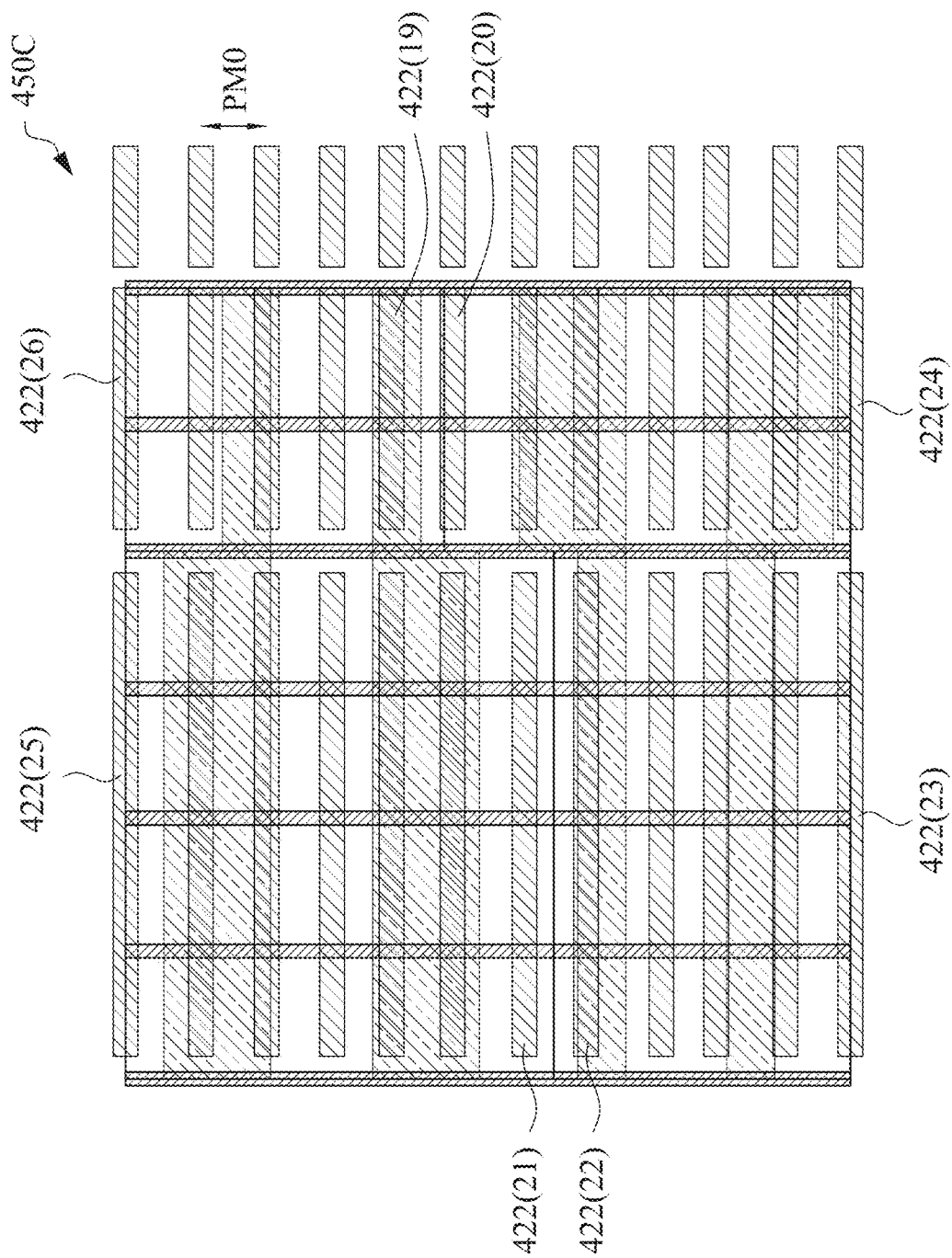

In FIG. 4C, layout diagram 450C is a variation of layout diagram 450A of FIG. 4A to which M0 conductive patterns (M0 patterns) have been added. Layout diagram 450C includes M0 patterns of which M0 patterns 422(19), 422(20), 422(21), 422(22), 422(23), 422(24), 422(25) and 422(26) are called out. The M0 level is sole-pitch, and accordingly a pitch $P_{M0}$ is shown as the sole pitch for M0 patterns.

Figure 4D:
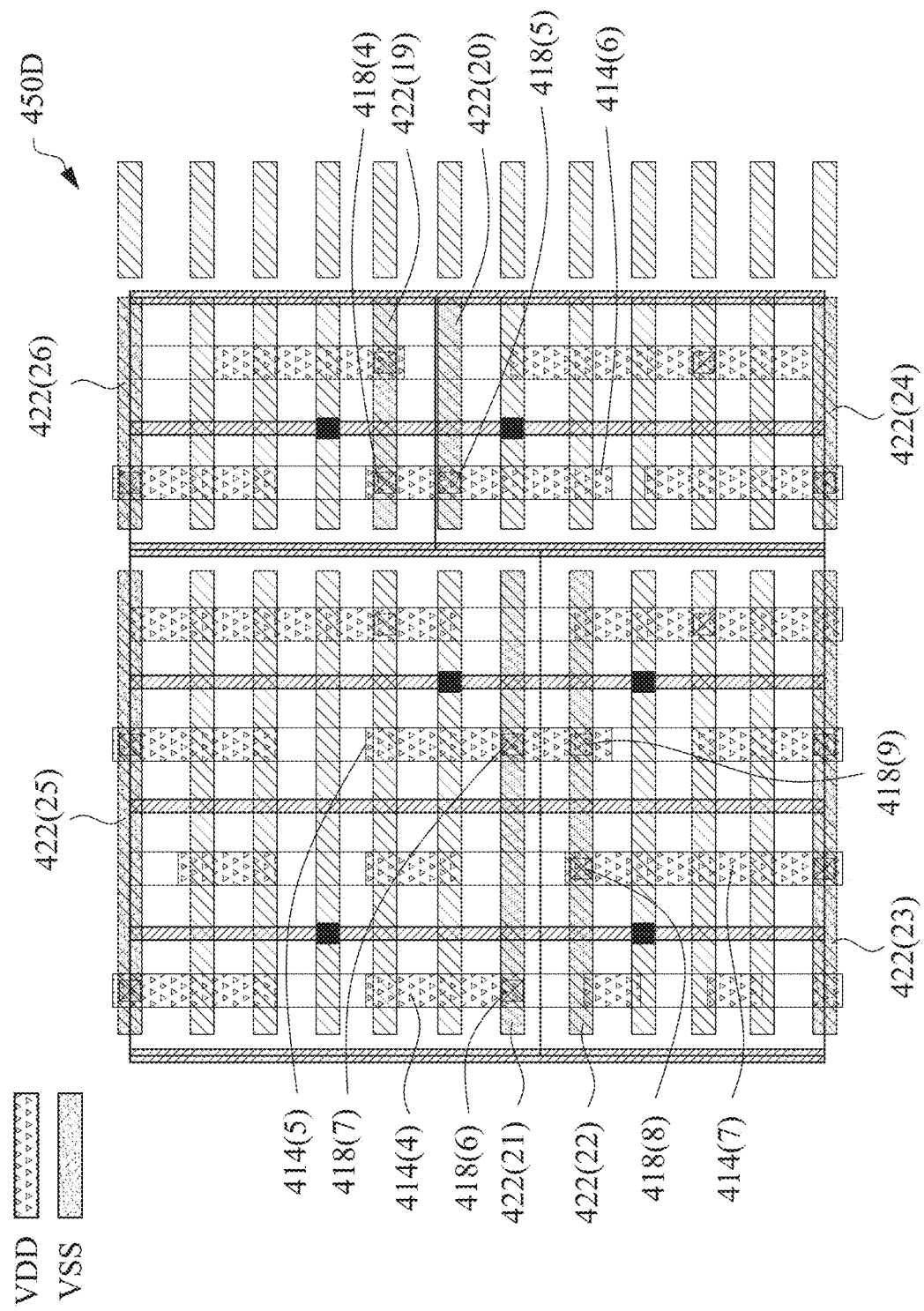

In FIG. 4D, layout diagram 450D is a variation based on a combination of layout diagrams 450B and 450C of corresponding FIGS. 4B and 4C to which MD patterns and VMD patterns have been added. For simplicity, AA patterns and CP patterns are not shown in layout diagram 450D. Layout diagram includes: MD patterns of which MD patterns 414(4), 414(5), 414(6) and 414(7) are called out; and VMD patterns of which VMD patterns 418(4), 418(5), 418(6), 418(7), 418(8) and 418(9) are called out. VMD patterns 418(4) and 418(5) are located at the intersection of MD pattern 414(6) and corresponding M0 patterns 422(19) and 422(20). VMD patterns 418(6) and 418(7) are located at the intersection of M0 pattern 422(21) and corresponding MD patterns 414(4) AND 414(5). VMD patterns 418(8) and 418(9) are located at the intersection of M0 pattern 422(22) and corresponding MD patterns 414(7) AND 414(5). Also, in layout diagram 450D, M0 patterns 422(19), 422(20), 422(21) and 422(22) are designated for VDD; and M0 patterns 422(23), 422(24), 422(25) and 422(26) as designated for VSS.

Figure 4E:
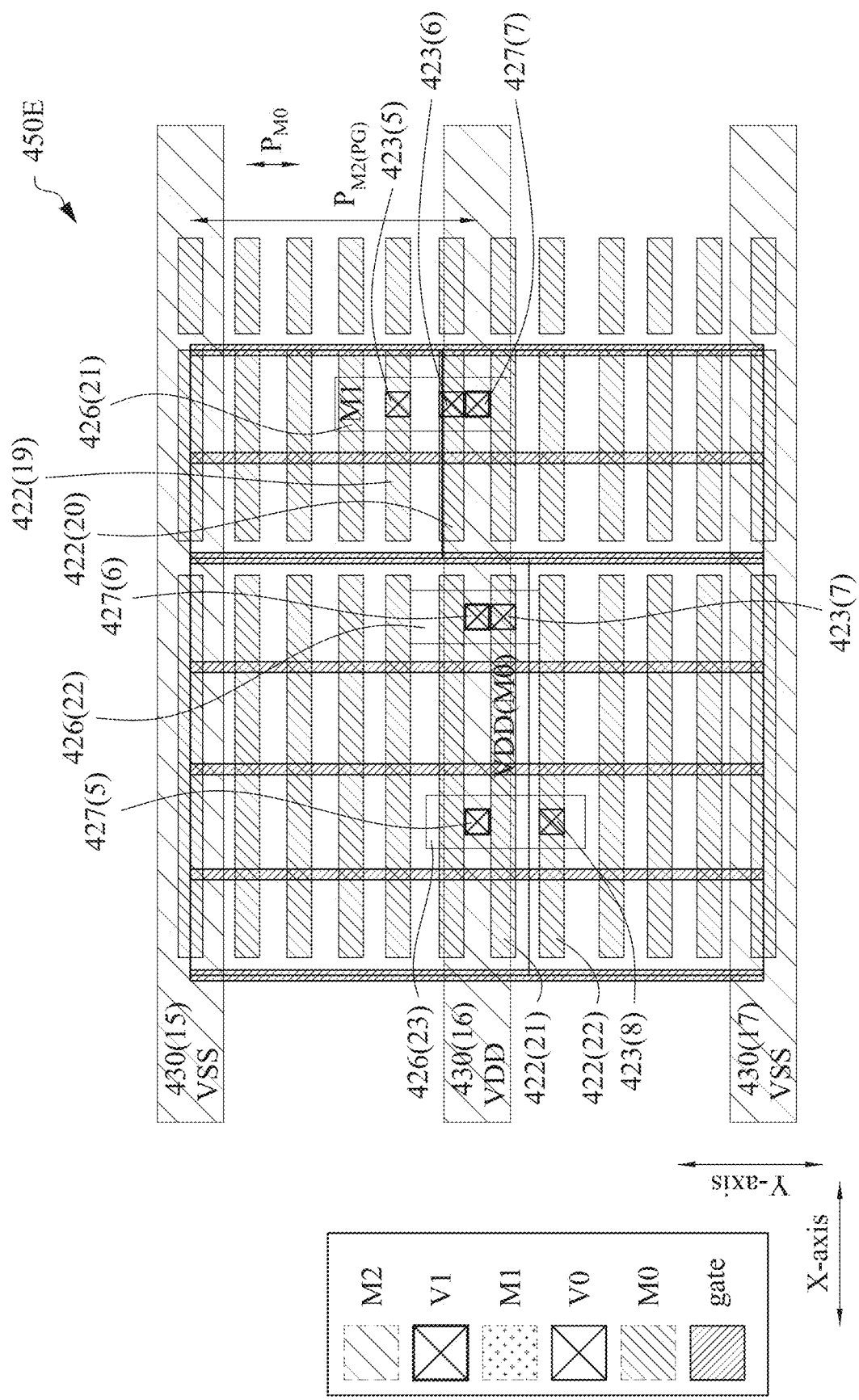

In FIG. 4E, layout diagram 450E is a variation of layout diagram 450D of FIG. 4D to which V0 patterns, M1 patterns, V1 patterns and M2 patterns have been added. For simplicity, MD patterns, VMD patterns and VG patterns are not shown in layout diagram 450E. Layout diagram 450E includes: V0 patterns 423(5), 423(6), 423(7) and 423(8); M1 patterns 426(21), 426(22) and 426(23); V1 patterns 427(5), 427(6) and 427(7); and M2 patterns 430(15), 430(16) and 430(17).

V0 patterns 423(5) and 423(6) are located at the intersections of M1 pattern 426(21) and corresponding M0 patterns 422(19) and 422(20). V0 pattern 423(7) is located at the intersection of M1 pattern 426(22) and M0 pattern 422(21). V0 pattern 423(8) is located at the intersection of M1 pattern 426(23) and M0 pattern 422(22). V1 pattern 427(5) is located at the intersection of M2 pattern 430(16) and M1 pattern 426(23). V1 pattern 427(6) is located at the intersection of M2 pattern 430(16) and M1 pattern 426(22). V1 pattern 427(7) is located at the intersection of M2 pattern 430(16) and M1 pattern 426(21).

Also, in layout diagram 450E, M2 patterns 430(15) and 430(17) are designated for VSS; and M2 pattern 430(16) is designated for VDD. For simplicity, M2 logic patterns are not shown in FIG. 4E. The M2 level is multi-pitch, with a pitch $P_{M2(PG)}$ being shown as the pitch for M2 PG patterns. M2 logic patterns (not shown) have a pitch $P_{M2(L)}$ (not shown).

Figure 4F:
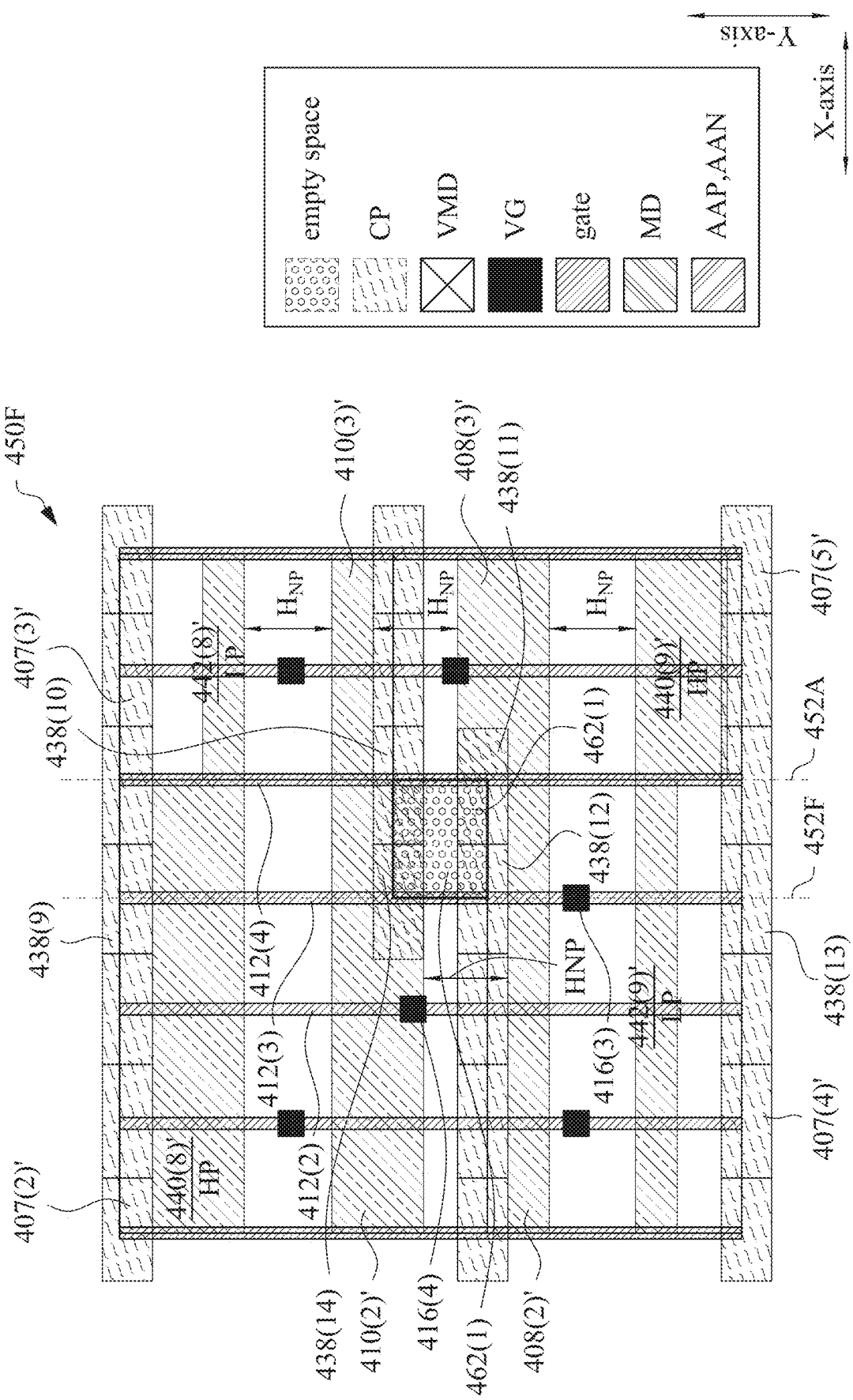

In FIG. 4F, layout diagram 450F is an alternative version of layout diagram 450B of FIG. 4B. Like layout diagram 450B, layout diagram 450 is a variation of layout diagram 450A of FIG. 4A to which CP patterns and VG patterns have been added. In layout diagram 450F, VG pattern 416(4) has been added over gate pattern 412(2), and gate pattern 416(2) that otherwise was over gate pattern 412(3) has been eliminated.

In layout diagram 450F, HP cells 440(8)' and 440(9)' and LP cells 442(8)' and 442(9)' of FIG. 4F are alternate versions of corresponding HP cells 440(8) and 440(9) and LP cells 442(8) and 442(9) of FIG. 4B. Reference line 452F is substantially parallel with gate pattern 412(3), whereas reference line 452A is substantially parallel with gate pattern 412(4). Relative to the X-axis: the right edge of HP cell 440(8)' and the left edge of LP cell 442(8)' abut reference line 452F; and the right edge of LP cell 442(9)' and the left edge of HP cell 440(9)' abut reference line 452A.

Between gate patterns 412(3) and 412(4), a portion of the left side of LP cell 442(8)' overlaps a portion on the right side of LP cell 442(9)'. In some embodiments, where two LP cells overlap such as the overlap between LP cell 442(8)' and LP cell 442(9)', a design rule calls for gate patterns to be cut in the overlapping area, resulting in empty space. In layout diagram 450F, CP pattern 438(14) has been added over gate pattern 412(3), whereas CP patterns 438(10), 438(11) and 438(12) are carried over from layout diagram 450B, which results in empty space 462(1).

Figure 5A:
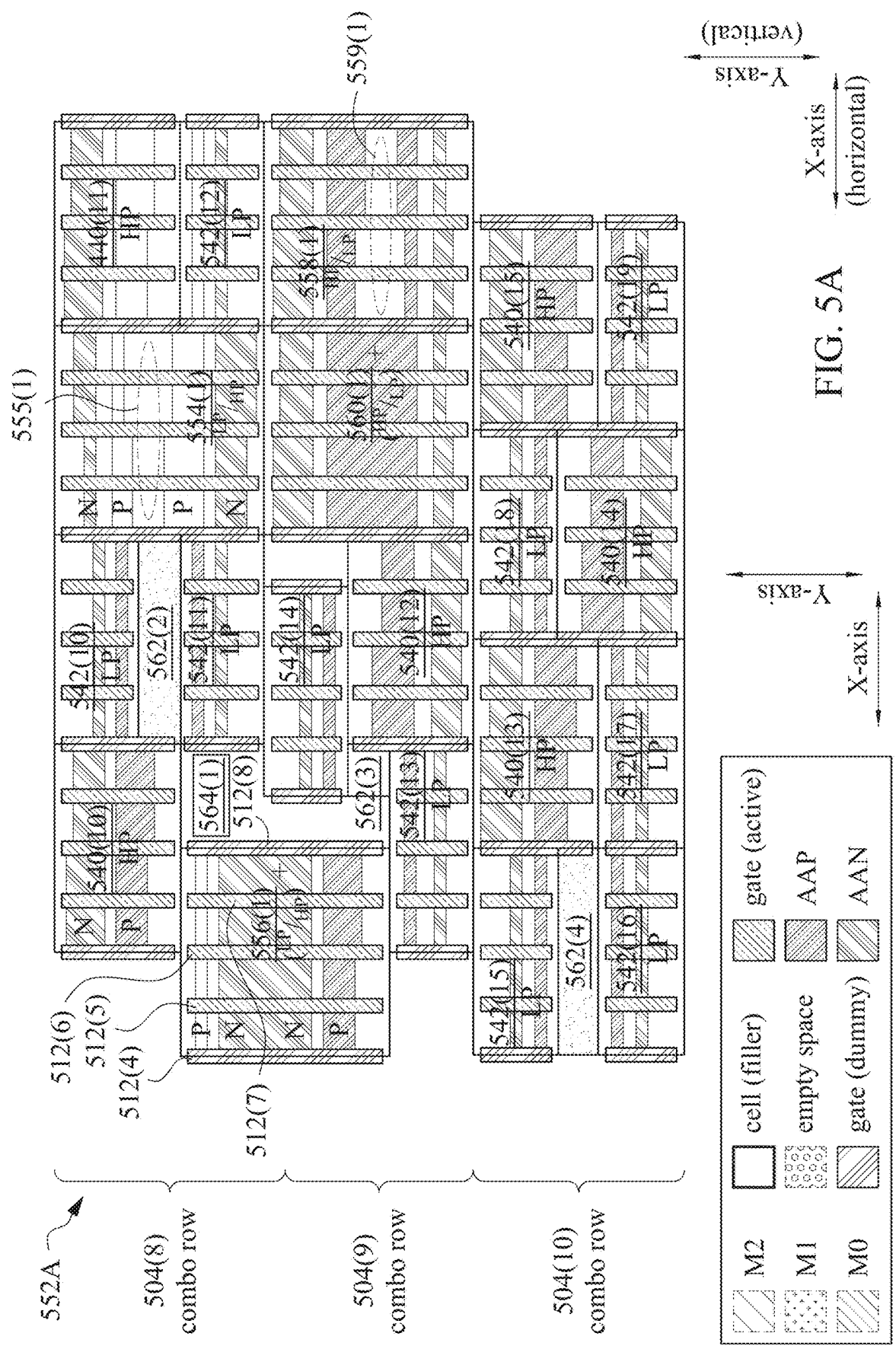
FIGS. 5A-5C are corresponding layout diagrams, in accordance with some embodiments.
Figure 5B:
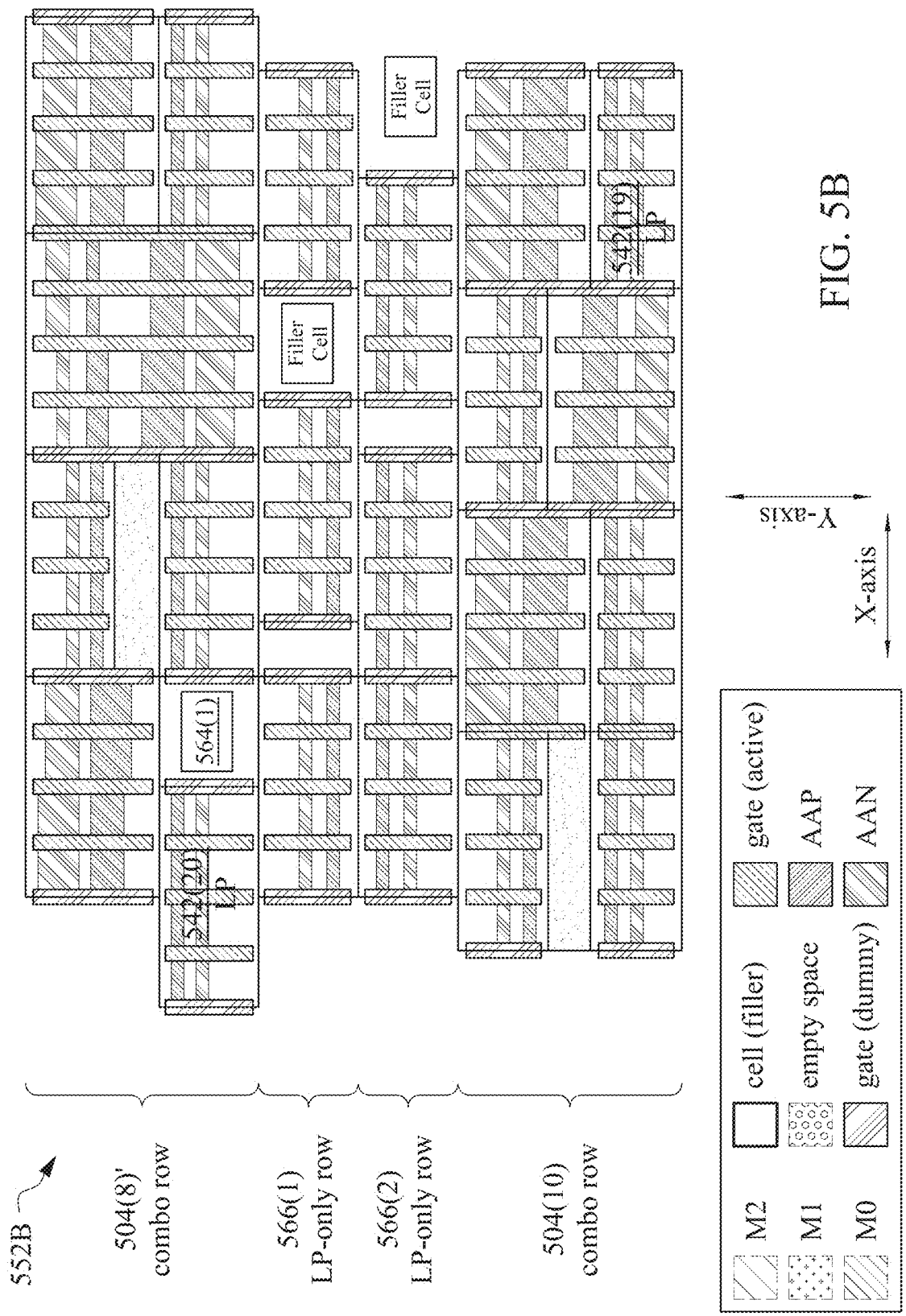
Figure 5C:
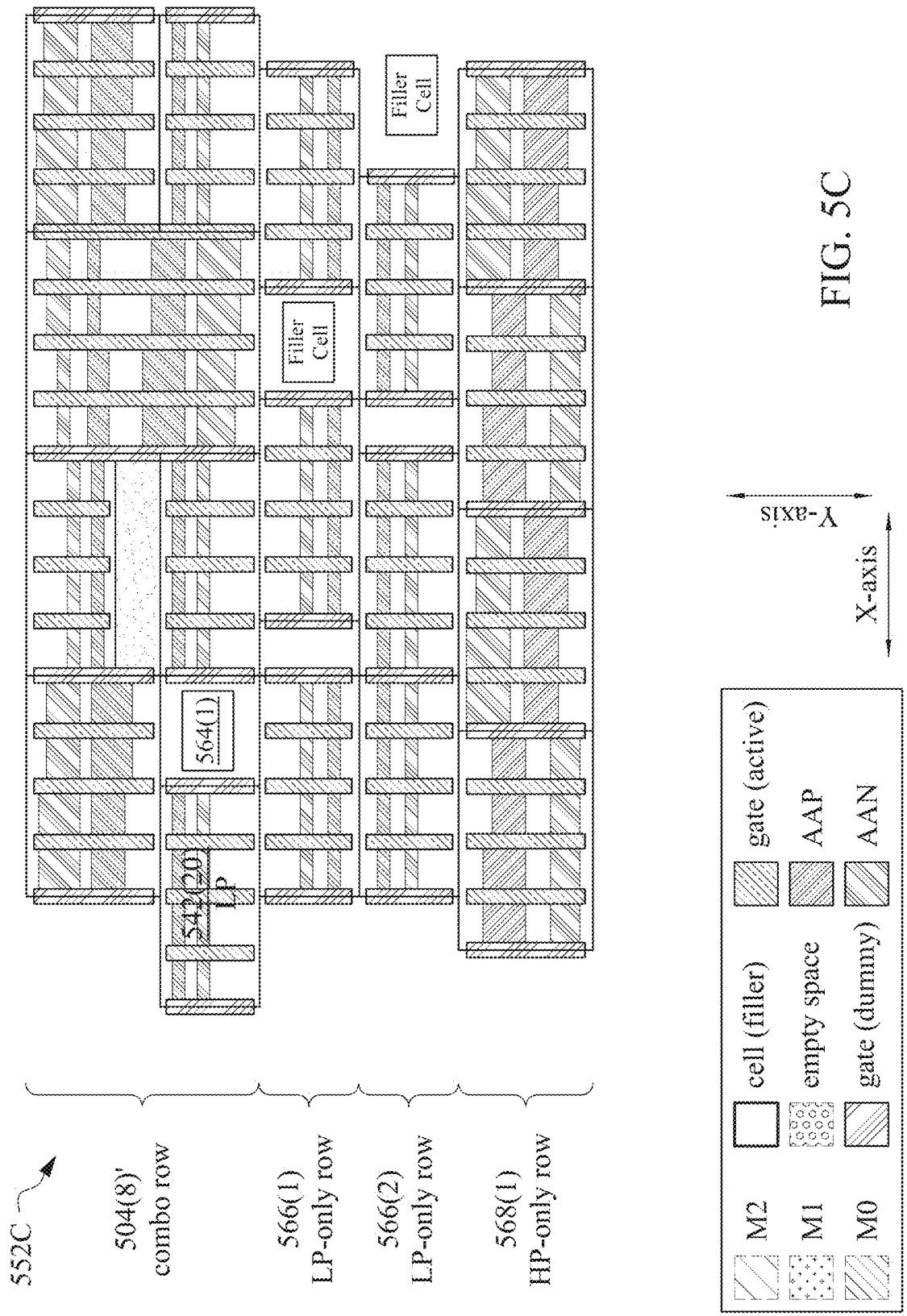

FIGS. 5A-5C are corresponding layout diagrams 552A, 552B and 552C, in accordance with some embodiments.

Layout diagrams 552A, 552B and 552C of FIGS. 5A-5C follow a numbering convention similar to that of FIGS. 4A-4F. To help identify components which correspond but nevertheless have differences, the numbering convention of FIGS. 5A-5C uses 5-series numbers whereas FIGS. 4A-4F uses 4-series numbers. For brevity, the discussion will focus more on differences between FIGS. 5A-5C and FIGS. 4A-4F than on similarities. Also for brevity, fewer than all elements of FIGS. 5A-5C are numbered.

In FIG. 5A, layout diagram 552A is organized into combo rows 504(8), 504(9) and 504(10). Combo row 504(8) includes HP cell 540(10), LP cell 542(10), LP cell 542(11), LP/HP cell 554(1), HP cell 540(11), and LP cell 542(11).

In combo row 504(8): LP cell 542(10) is stacked over LP cell 542(11), resulting in empty space 562(2) in between; and HP cell 540(11) is stacked over LP cell 542(12) in an HP/LP stack of two discrete cells. In some embodiments, some empty space in layout diagram 552A is filled with a filler cell, e.g., filler cell 564(1).

Combo row 504(8) further includes an LP/HP cell 544(1). While similar to an LP/HP stack, LP/HP cell 544(1) is one integral cell rather than being a stack of two discrete cells, namely an LP cell over an HP cell. Like an LP/HP stack, relative to the Y-axis, LP/HP cell 544(1) includes a gap 555(1) between central AA patterns which have the same conductivity designation, which is PMOS in LP/HP cell 544(1).

In FIG. 5A, combo row 504(9) includes: LP cell 542(13), LP cell 542(14), HP cell 540(12, (HP/LP)$^+$ cell 560(1), and HP/LP cell 558(1). In combo row 504(9), relative to the Y-axis, a portion at the left side of LP cell 542(14) is stacked over a portion at the right side LP cell 542(13), resulting in empty space 562(3) in between.

While similar to an HP/LP stack, HP/LP cell 558(1) is one integral cell rather than being a stack of two discrete cells, namely an HP cell over an LP cell. Like an HP/LP stack, relative to the Y-axis, HP/LP cell 558(1) includes a gap 559(1) between central AA patterns which have the same conductivity designation, which is PMOS in HP/LP cell 558(1).

While similar to an HP/LP cell, (HP/LP)$^+$ cell 560(1) does not have a gap between central AA patterns of the same conductivity designation. Rather than two discrete AA patterns, the central region of (HP/LP)$^+$ cell 560(1) has a single central AA pattern. The area in (HP/LP)$^+$ cell 560(1) that would be a gap in an otherwise similar HP/LP cell represents a 'bonus' AA pattern with the result that the single central AA pattern represents a larger area than the cumulative area of the two discrete central AA patterns of an otherwise similar HP/LP cell. In some embodiments, a cell region based on (HP/LP)$^+$ cell 560(1) has a greater current capacity than a cell region based on an otherwise similar HP/LP cell because of the bonus AA pattern in (HP/LP)$^+$ cell 560(1).

In FIG. 5A, combo row 504(10) includes: LP cell 542(15), LP cell 542(16), HP cell 540(13), LP cell 542(17), LP cell 542(18), HP cell 540(14), HP cell 540(15) and LP cell 542(19).

In combo row 504(10), relative to the Y-axis: LP cell 542(15) is stacked over LP cell 542(16), resulting in empty space 562(4) in between; HP cell 540(13) is stacked over LP cell 542(17) in an HP/LP stack of two discrete cells; LP cell 542(18) is stacked over HP cell 540(14) in an LP/HP stack of two discrete cells; and HP cell 540(15) is stacked over LP cell 542(19) in an HP/LP stack of two discrete cells.

Layout diagram 552A further includes a (LP/HP)⁺ cell 556(1) which is partially located in combo row 504(8) and partially located in combo row 504(9). While similar to an LP/HP cell, (LP/HP)⁺ cell 556(1) does not have a gap between central AA patterns of the same conductivity designation. Rather than two discrete AA patterns, the central region of (LP/HP)⁺ cell 556(1) has a single central AA pattern. The area in (LP/HP)⁺ cell 556(1) that would be a gap in an otherwise similar LP/HP cell represents a 'bonus' AA pattern with the result that the single central AA pattern represents a larger area than the cumulative area of the two discrete central AA patterns of an otherwise similar LP/HP cell. In some embodiments, a cell region based on (LP/HP)⁺ cell 556(1) has a greater current capacity than a cell region based on an otherwise similar LP/HP cell because of the bonus AA pattern in (LP/HP)⁺ cell 556(1).

In FIG. 5A, relative to the X-axis, gate patterns at the edges of a given cell are dummy patterns for which corresponding gate structures in a cell region based on the given cell will not be active, e.g., will not conduct corresponding signals involved in the operation of the cell region. By contrast, in FIG. 5A, relative to the X-axis, gate patterns not at the edges but instead at the interior of the given cell are active patterns for which corresponding gate structures in the cell region based on the given cell will be active, e.g., will conduct corresponding signals involved in the operation of the cell region.

In FIG. 5B, layout diagram 552B is a variation of layout diagram 552A of FIG. 5A. Layout diagram 552B includes LP-only rows 566(1) and 566(2) which have replaced combo row 504(9) of FIG. 5A. Relative to the Y-axis, each of LP-only rows 566(1) and 566(2) is configured with the height $H_{LP}$ of LP cells and so is configured to have only LP cells placed therein. LP-only rows 566(1) and 566(2) and interspersed between combo rows 504(8)' and 504(10). While similar to combo row 504(8) of FIG. 5A, combo row 504(8)' of FIG. 5B does not include (LP/HP)⁺ cell 556(1) but instead includes LP cell 542(20) in a location corresponding to what otherwise would be the upper portion of (LP/HP)⁺ cell 556(1).

In FIG. 5C, layout diagram 552C is a variation of layout diagram 552B of FIG. 5B. Layout diagram 552C includes an HP-only row 568(1) which has replaced combo row 504(10) of FIG. 5B. Relative to the Y-axis, HP-only row 568(1) is configured with the height $H_{HP}$ of HP cells and so is configured to have HP cells placed therein. While LP cells can be placed in HP-only row 568(1), doing so wastes space within HP-only row 568(1).

Figure 6A:
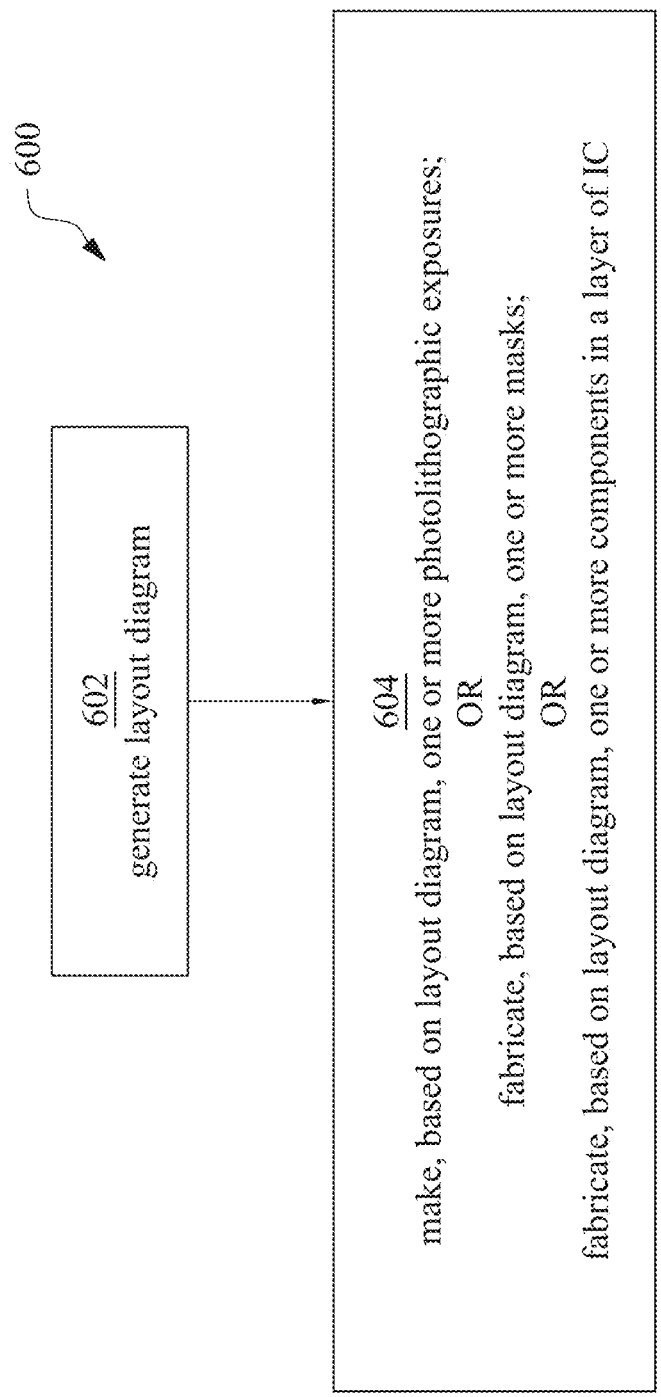
FIG. 6A is a flowchart of a method of manufacturing a semiconductor device, in accordance with some embodiments.

FIG. 6A is a flowchart of a method 600 of generating a layout diagram, in accordance with some embodiments.

Method 600 is implementable, for example, using EDA system 700 (FIG. 7, discussed below) and an integrated circuit (IC), manufacturing system 800 (FIG. 8, discussed below), in accordance with some embodiments. Regarding method 600, examples of the layout diagram include layout diagram 348A of FIG. 3A, or the like. Examples of a semiconductor device which can be manufactured according to method 600 include semiconductor device 100 FIG. 1.

In FIG. 6A, method 600 includes blocks 602-604. At block 602, a layout diagram is generated which, among other things, includes a heating arrangement for a waveguide arrangement as in, e.g., FIGS. 3A and 4A-4F. An example of a semiconductor device corresponding to a layout generated by method 600 includes semiconductor device 100 of FIG. 1. Block 602 is implementable, for example, using EDA system 700 (FIG. 7, discussed below), in accordance with some embodiments. Regarding block 602, examples of the layout diagrams which are generated according to block 602 include the layout diagrams of FIGS. 3A and 4A-4F, or the like. Examples of a semiconductor device which can be manufactured based on layout diagrams generated according to block 602 include semiconductor device 100 FIG. 1, semiconductor devices including the cross-sections of FIG. 3B, semiconductor devices based on the layout diagrams of FIGS. 3A and 4A-4F, or the like. Block 602 is discussed in more detail below with respect to FIG. 6B. From block 602, flow proceeds to block 604.

At block 604, based on the layout diagram, at least one of (A) one or more photolithographic exposures are made or (B) one or more semiconductor masks are fabricated or (C) one or more components in a layer of a semiconductor device are fabricated. See discussion below of FIG. 8.

Figure 6B:
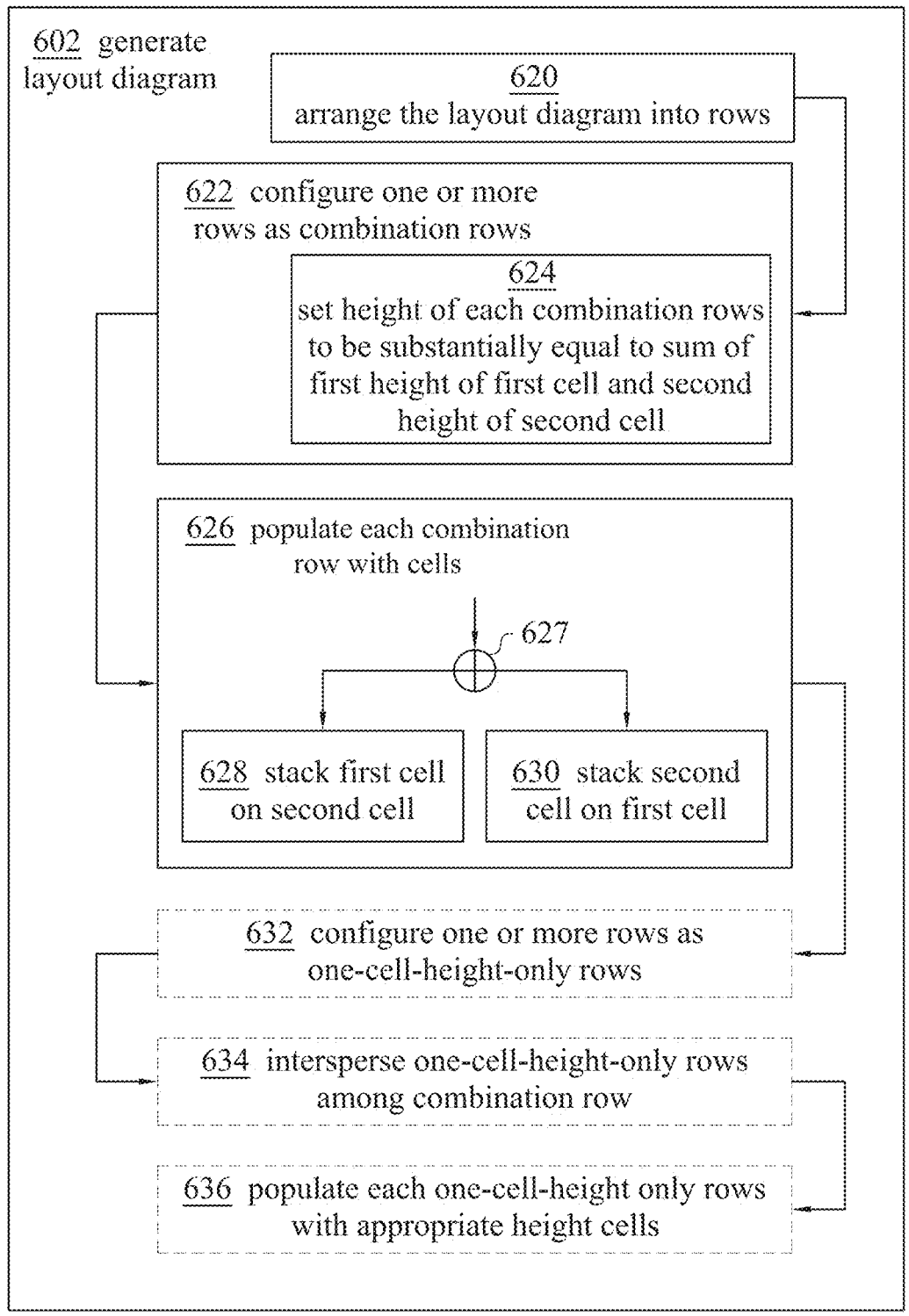
FIGS. 6B-6C are corresponding flowcharts of corresponding methods of generating a layout diagram, in accordance with some embodiments.

FIG. 6B is a flowchart of a method of generating a layout diagram, in accordance with some embodiments.

More particularly, the flowchart of FIG. 6B shows additional blocks included in block 602 of FIG. 6A, in accordance with one or more embodiments. In FIG. 6B, block 602 includes blocks 620-636. Blocks 632-636 are optional, as indicated by the phantom (dashed lines).

In FIG. 6B, at block 620, the layout diagram is arranged into rows. An example of a layout diagram arranged into rows is layout diagram 246 of FIG. 2A. From block 620, flow proceeds to block 622.

At block 622, one of more of the rows in the layout diagram are configured as combination rows. Examples of combination (combo) rows include combo rows include combo rows 104(3) and 104(4) of FIG. 2A, combo rows 304(5) and 304(6) of FIG. 3C, combo row 404(7) of FIG. 4A, combo rows 504(8)-504(10) of FIG. 5A, or the like. Block 622 includes block 624.

At block 624, the height of each combo row is set to be substantially equal to a sum of a first height of a first cell and a second height of a second cell. The first and second cells are different, and correspondingly the first and second heights are different. Examples of the first cell include HP cells 240(1)-240(3) of FIG. 2A, which have a height $H_{HP}$. Examples of the second cell include LP cells 242(1)-242(3) of FIG. 2A, which have a height $H_{LP}$, where $H_{LP}<H_{HP}$. And vice versa, namely: examples of the first cell include LP cells 242(1)-242(3) of FIG. 2A; and examples of the second cell include HP cells 240(1)-240(3) of FIG. 2A. From block 624, flow exits block 622 and proceeds to block 626.

At block 626, each combo row is populated with cells. Block 626 includes blocks 628 and 630. In block 626, flow can proceed to either block 628 or block 630, or to both, as indicated by the OR-flow symbol 627.

At block 628, within a given row, a first cell is stacked on a second cell. An example of a first cell stacked on a second cell is HP cell 240(1) stacked on LP cell 242(1) in row 104(3) of FIG. 2A, or the like, which represents an HP/LP stack. Another example of a first cell stacked on a second cell is HP cell 240(3) stacked on LP cell 242(3) in row 104(4) of FIG. 2A, or the like, which represents another HP/LP stack. Flow exits block 628 proceeds to exit block 626, proceeds to loop back to block 628, or proceeds to block 630.

In some embodiments, the HP/LP stack is configured as an HP/LP cell, which is an integral cell as compared to the two discrete cells of the HP/LP stack. An example of an HP/LP cell is HP/LP cell 558(1) in FIG. 5A or the like. In some embodiments, the HP/LP stack is configured as an (HP/LP)+ cell. An example of an (HP/LP)+ cell is (HP/LP)+ cell 560(1) of FIG. 5A, or the like.

In some embodiments, rather than stack an HP cell on an LP cell to form an HP/LP stack which is then converted to an HP/LP cell, instead the stacking and conversion are replaced by selecting an HP/LP cell from a corresponding library of standard cells. In some embodiments, rather than stack an HP cell on an LP cell to form an HP/LP stack which is then converted to an (HP/LP)+, instead the stacking and conversion are replaced by selecting an (HP/LP)+ cell from a corresponding library of standard cells.

At block 630, within a given row, a second cell is stacked on a first cell. An example of a second cell stacked on a first cell is LP cell 242(2) stacked on HP cell 240(2) in row 104(3) in FIG. 2A, or the like, which represents an LP/HP stack. Flow exits block 630 and proceeds to loop back to block 630, proceeds to block 628, or exits block 626.

In some embodiments, the LP/HP stack is configured as an LP/HP cell, which is an integral cell as compared to the two discrete cells of the LP/HP stack. An example of an LP/HP cell is LP/HP cell 554(1) in FIG. 5A or the like. In some embodiments, the LP/HP stack is configured as an (LP/HP)+ cell. An example of an (LP/HP)+ cell is (LP/HP)+ cell 556(1) of FIG. 5A, or the like.

In some embodiments, rather than stack an LP cell on an HP cell to form an LP/HP stack which is then converted to an LP/HP cell, instead the stacking and conversion are replaced by selecting an LP/HP cell from a corresponding library of standard cells. In some embodiments, rather than stack an LP cell on an HP cell to form an LP/HP stack which is then converted to an (LP/HP)+, instead the stacking and conversion are replaced by selecting an (LP/HP)+ cell from a corresponding library of standard cells.

From block 626, flow proceeds to block 632. Again, blocks 632-636 are optional, as indicated by the phantom (dashed lines). FIG. 6B assumes that blocks 632-636 are either all included in the flow, or none are included in the flow. In some embodiments, blocks 632 and 636 are included in the flow but block 634 is not.

At optional block 632, one or more rows are configured as one-cell-height-only rows. Examples of one-cell-height-only rows include LP-only rows 566(1) and 566(2) of FIG. 5B, HP-only row 568(1) of FIG. 5C, or the like. From block 632, flow proceeds to block 634.

At block 634, the one-cell-height-only rows are interspersed with the combo rows.

Examples of one-cell-height-only rows being interspersed with the combo rows include LP-only rows 566(1) and 566(2) of FIG. 5B, LP-only rows 566(1) and 566(2) and HP-only row 568(1) of FIG. 5C, or the like. From block 634, flow proceeds to block 636.

At block 636, each one-cell-height-only row is populated with appropriate height cells. Examples of populating one-cell-height-only rows with appropriate height cells include LP-only rows 566(1) and 566(2) of FIGS. 5B-5C being populated with LP cells, HP-only row 568(1) being populated with HP cells, or the like.

Figure 6C:
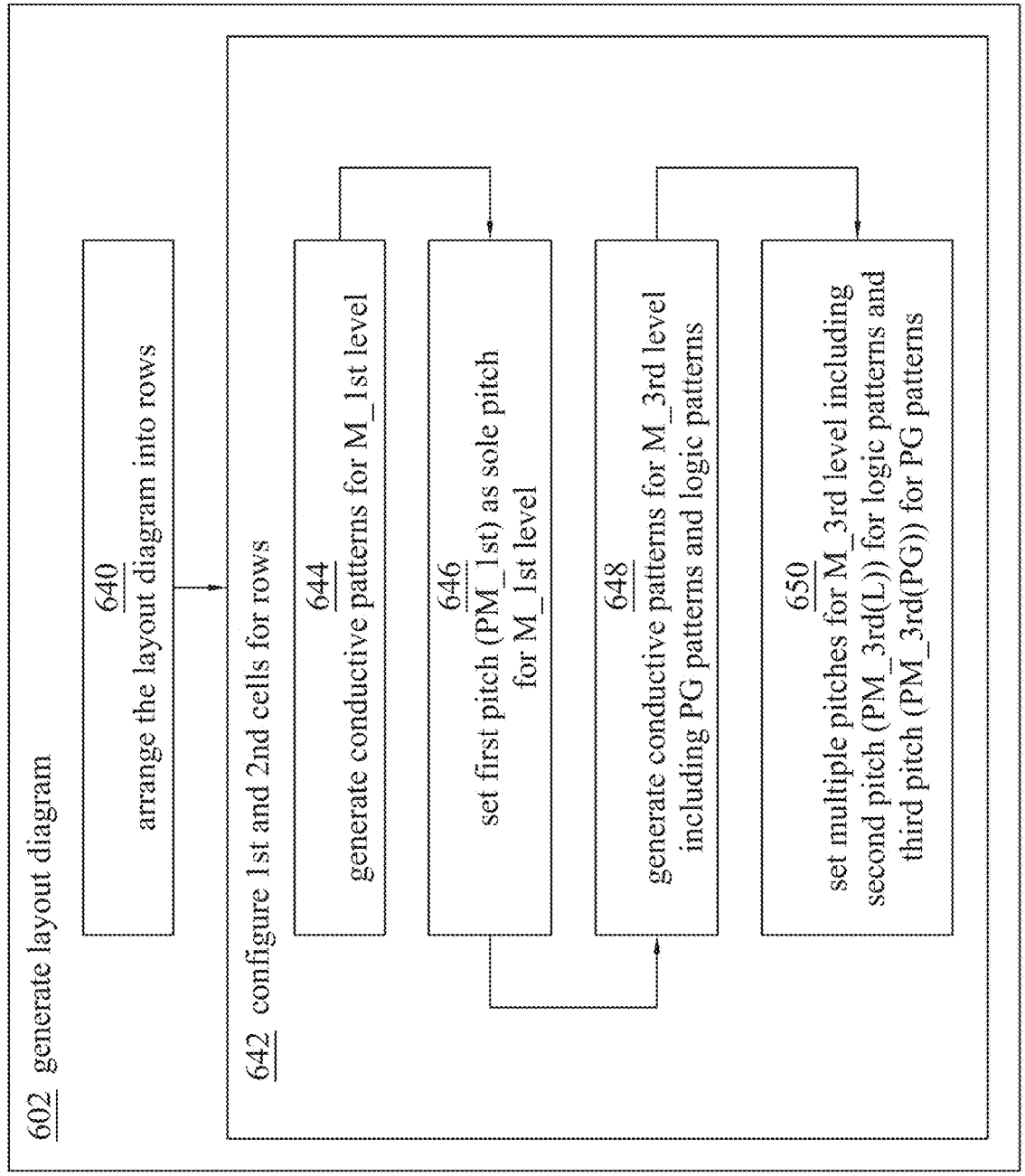

FIG. 6C is a flowchart of a method of generating a layout diagram, in accordance with some embodiments.

More particularly, the flowchart of FIG. 6C shows additional blocks included in block 602 of FIG. 6A, in accordance with one or more embodiments. In FIG. 6C, block 602 includes blocks 640-650.

In FIG. 6C, at block 640, the layout diagram is arranged into rows. An example of a layout diagram arranged into rows is layout diagram 246 of FIG. 2A or the like. From block 640, flow proceeds to block 642.

At block 642, first and second cells are configured for the rows. Examples of the first cells include HP cells 440(8) and 440(9) of FIG. 4A. Examples of the second cells include LP cells 442(8) and 442(9) of FIG. 4A. And vice versa, namely: examples of the first cell include LP cells 440(8)-440(9) of FIG. 4A; and examples of the second cell include HP cells 440(8)-440(9) of FIG. 4A.

Block 642 includes blocks 644-650. At block 644, conductive patterns for the M_1st level are generated. An example of the M_1st level is the M0 level of FIG. 4C or the like. Examples of the M0 conductive patterns (M0 patterns) are the M0 patterns in FIG. 4C, of which M0 patterns M0 patterns 422(19), 422(20), 422(21), 422(22), 422(23), 422(24), 422(25) and 422(26) are called out. From block 644, flow proceeds to block 646.

At block 646, a first pitch ($P_{M\_1st}$) is set as a sole pitch for the M_1st level. An example of $P_{M\_1st}$ is $P_{M0}$ in FIGS. 2B, 4C, 4E, or the like. From block 646, flow proceeds to block 648.

At block 648, conductive patterns for the M_3rd level are generated. An example of the M_3rd level is the M2 level of FIG. 4E or the like. Examples of the M2 conductive patterns (M2 patterns) are M2 patterns 430(15)-430(17) in FIG. 4E, M2 patterns 230(1)-230(5) in FIG. 2B, or the like. From block 648, flow proceeds to block 650.

At block 650, multiple pitches are set for the M_3rd level are set so that the M_3rd level is multi-pitch, including a second pitch ($P_{M\_3rd(L)}$) for logic patterns and a third pitch ($P_{M\_3rd(PG)}$) for PG patterns. An example of $P_{M\_3rd(L)}$ is $P_{M2(L)}$ in FIG. 2B, or the like. Examples of $P_{M\_3rd(PG)}$ are $P_{M2(PG)}$ in FIG. 2B, 4E, or the like.

Figure 7:
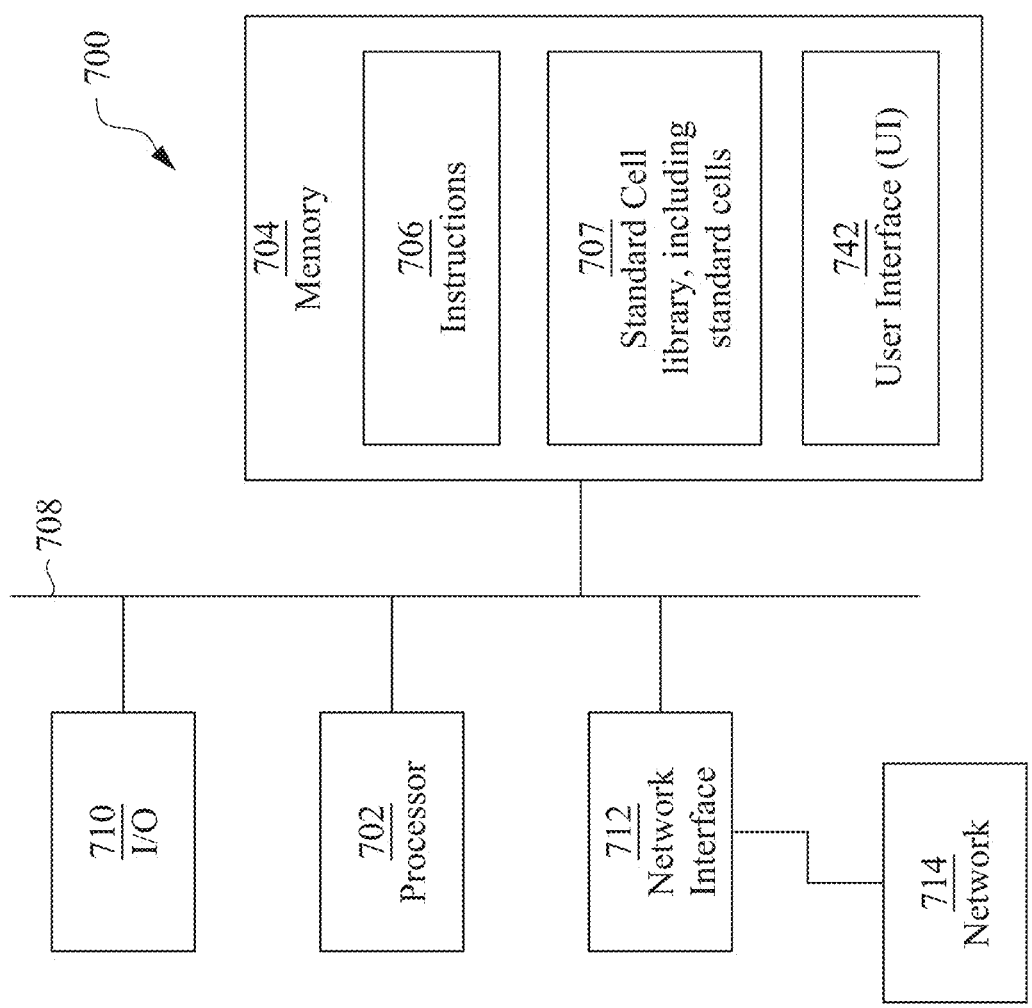
FIG. 7 is a block diagram of an electronic design automation (EDA) system in accordance with some embodiments.

FIG. 7 is a block diagram of an electronic design automation (EDA) EDA system 700 in accordance with some embodiments.

In some embodiments, EDA system 700 includes an APR system. Methods described herein of designing layout diagrams represent wire routing arrangements, in accordance with one or more embodiments, are implementable, for example, using EDA system 700, in accordance with some embodiments.

In some embodiments, EDA system 700 is a general purpose computing device including a hardware processor 702 and a non-transitory, computer-readable storage medium 704. Storage medium 704, amongst other things, is encoded with, i.e., stores, computer program code 706, i.e., is a set of computer-executable instructions. Execution of instructions 706 by hardware processor 702 represents (at least in part) an EDA tool which implements a portion or all of the methods described herein in accordance with one or more embodiments (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code 706 configured to cause EDA system 700 (where such execution represents (at least in part) the EDA tool) to be usable for performing a portion or all of the noted processes and/or methods. In one or more embodiments, storage medium 704 also stores information which facilitates performing a portion or all of the noted processes and/or methods. In one or more embodiments, storage medium 704 stores library 707 of standard cells including such standard cells as disclosed herein.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 also includes network interface 712 coupled to processor 702. Network interface 712 allows EDA system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

EDA system 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
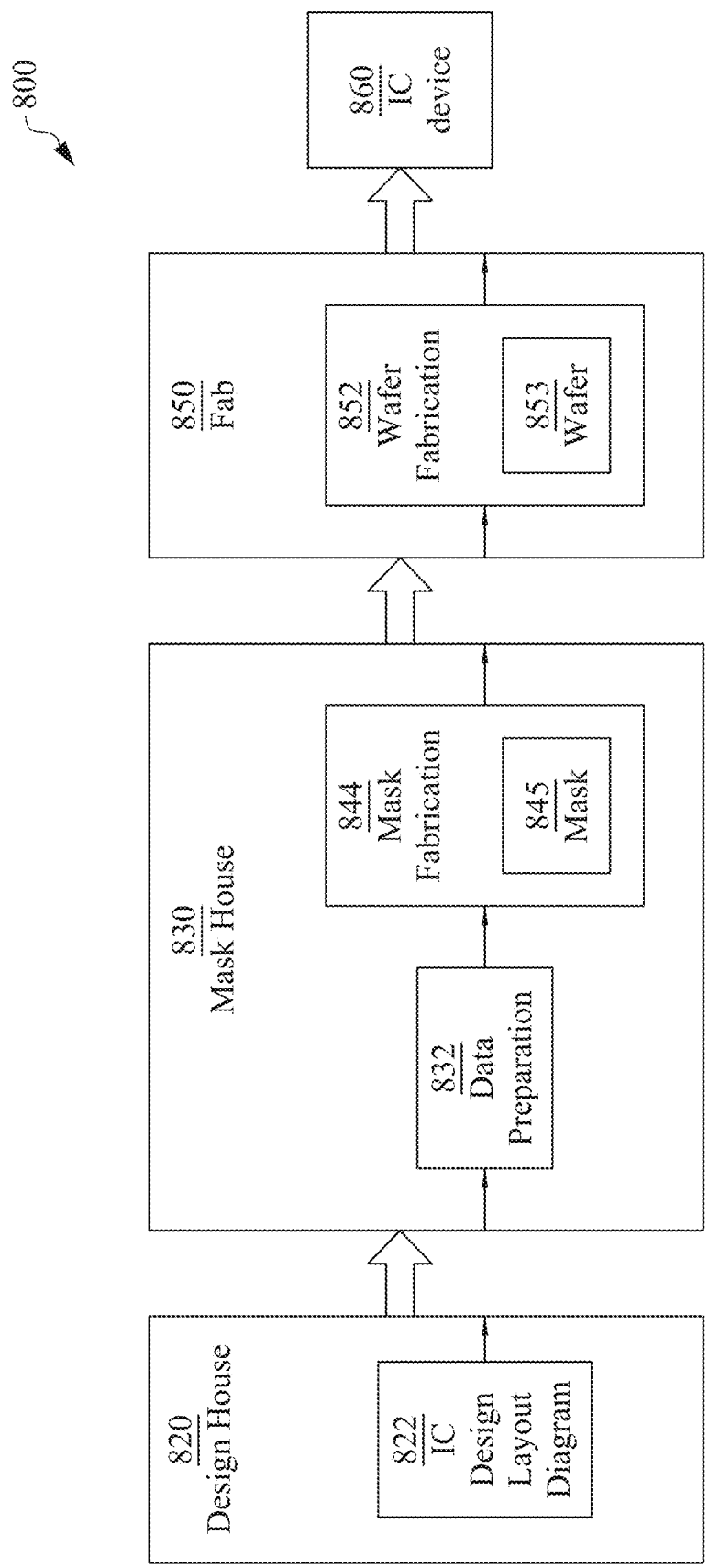
FIG. 8 is a block diagram of a semiconductor device manufacturing system, and an IC manufacturing flow associated therewith, in accordance with some embodiments.

FIG. 8 is a block diagram of an integrated circuit (IC, manufacturing system 800, and an IC manufacturing flow associated therewith, in accordance with some embodiments.

In some embodiments, based on a layout diagram, e.g., at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 is an IC fabrication business that includes one or more manufacturing facilities for the fabrication of a variety of different IC products. In some embodiments, IC fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 includes fabrication tools 852 configured to execute various manufacturing operations on semiconductor wafer 853 such that IC device 860 is fabricated in accordance with the mask(s), e.g., mask 845. In various embodiments, fabrication tools 852 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

Details regarding an integrated circuit (IC) manufacturing system (e.g., system 800 of FIG. 8), and an IC manufacturing flow associated therewith are found, e.g., in U.S. Pat. No.

9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

In an embodiment, a method (of manufacturing a semiconductor device, for a layout diagram stored on a non-transitory computer-readable medium) includes generating the layout diagram including: arranging the layout diagram into rows which extend substantially in a first direction; configuring one or more of the rows as combination rows, the combination-row-configuring including: relative to a second direction substantially perpendicular to the first direction, setting a height of each of the one or more combination rows to be substantially equal to a sum of a first height of a first cell and a second height of a second cell; the first cell being different than the second cell, and the first height being different than the second height; and populating each of the one or more combination rows including: within at least one of the one or more combination rows and relative to the second direction, stacking a first instance of the first cell on a first instance of the second cell; or within at least one of the one or more combination rows and relative to the second direction, stacking a second instance of the second cell on a second instance of the first cell. In an embodiment, the method further includes, based on the layout diagram, at least one of: (A) making one or more photolithographic exposure; (B) fabricating one or more semiconductor masks; or (C) fabricating at least one component in a layer of a semiconductor integrated circuit. In an embodiment, the first cell is a high power (HP) cell and the second cell is a low power (LP) cell; or the first cell is an LP cell and the second cell is an HP cell. In an embodiment, the populating further includes: within at least one of the one or more combination rows and relative the second direction: stacking a third instance of the first cell on a third instance of the second cell resulting in 1st/2nd stack; and configuring the 1st/2nd stack as an integral cell; or within at least one of the one or more combination rows and relative the second direction: stacking a fourth instance of the second cell on a fourth instance of the first cell resulting in a 2nd/1st stack; and configuring the 2nd/1st stack as an integral cell. In an embodiment, the generating the layout diagram further includes: configuring one or more rows as first-cell-only rows, the first-cell-only configuring including: relative to the second direction, setting a height of each of the one or more first-cell-only rows to be substantially equal to the first height of the first cell; relative to the second direction, interspersing the one or more first-cell-only rows among the one or more combination rows; and populating each of the one or more first-cell-only rows including: within each of the one or more first-cell-only rows, inserting another instance of the first cell. In an embodiment, the generating the layout diagram further includes: configuring one or more rows as second-cell-only rows, the second-cell-only configuring including: relative to the second direction, setting a height of each of the one or more second-cell-only rows to be substantially equal to the second height of the second cell; interspersing the one or more second-cell-only rows among the one or more combination rows and among the one or more first-cell-only rows; and populating each of the one or more second-cell-only rows including: within each of the one or more second-cell-only rows, inserting at least another instance of the second cell. In an embodiment, the generating the layout diagram further includes: configuring one or more rows as second-cell only rows, the second-cell-only configuring including: relative to the second direction, setting a height of each of the one or more second-cell-only rows to be substantially equal to the second height of the second cell; interspersing the one or more second-cell-only rows among the one or more combination rows; and populating each of the one or more second-cell-only rows including: within each of the one or more second-cell-only rows, inserting at least another instance of the second cell. In an embodiment, the generating the layout diagram further includes: configuring each of the first and second cells including: generating conductive patterns for a first metallization level (M_1st level) and having corresponding long axes extending substantially in the first direction; relative to the second direction, setting a first pitch as a sole pitch for the M_1st level, the first pitch being for conductive patterns; generating conductive patterns for a third metallization level (M_3rd level) including conductive patterns for a power grid (PG patterns) and conductive patterns for control or data signals (logic patterns); and relative to the second direction, setting multiple pitches for the M_3rd level, the multiple pitches including: a second pitch for logic patterns; and a third pitch for PG patterns, the third pitch being greater than the second pitch.

In an embodiment, a method (of manufacturing a semiconductor device, for a layout diagram stored on a non-transitory computer-readable medium) includes generating the layout diagram including: arranging the layout diagram into rows which extend substantially in a first direction; and configuring first and second cells for the rows including: generating conductive patterns for a first metallization level (M_1st level); relative to a second direction substantially perpendicular to the first direction, setting a first pitch as a sole pitch for the M_1st level, the first pitch being for conductive patterns; generating conductive patterns for a third metallization level (M_3rd level) including conductive patterns for a power grid (PG patterns) and conductive patterns for control or data signals (logic patterns); and relative to the second direction, setting multiple pitches for the M_3rd level, the multiple pitches including: a second pitch for logic patterns; and a third pitch for PG patterns, the third pitch being greater than the second pitch. In an embodiment, the method further includes, based on the layout diagram, at least one of: (A) making one or more photolithographic exposure; (B) fabricating one or more semiconductor masks; or (C) fabricating at least one component in a layer of a semiconductor integrated circuit. In an embodiment, the generating the layout diagram further includes: configuring one or more of the rows as combination rows including: relative to the second direction, setting a height of each of the one or more combination rows to be substantially equal to a sum of a first height of a first cell and a second height of a second cell; the first cell being different than the second cell, and the first height being different than the second height; and populating each of the one or more combination rows including: within at least one of the one or more combination rows and relative to the second direction, stacking a first instance of the first cell on a first instance of the second cell; or within at least one of the one or more combination rows and relative to the second direction, stacking a second instance of the second cell on a second instance of the first cell. In an embodiment, the first cell is a high power (HP) cell and the second cell is a low power (LP) cell; or the first cell is an LP cell and the second cell is an HP cell. In an embodiment, the populating further includes: within at least one of the one or more combination rows and relative the second direction: stacking a third instance of the first cell on a third instance of the second cell resulting in 1st/2nd stack; and configuring the 1st/2nd stack as an integral cell; or within at least one of the one or more combination rows and relative the second direction: stacking a fourth instance of the second cell on a fourth instance of the first cell resulting in a 2nd/1st stack; and configuring the 2nd/1st stack as an integral cell. In an embodiment, the generating the layout diagram further includes: configuring one or more rows as first-cell-only rows, the first-cell-only configuring including: relative to the second direction, setting a height of each of the one or more first-cell-only rows to be substantially equal to the first height of the first cell; relative to the second direction, interspersing the one or more first-cell-only rows among the one or more combination rows; and populating each of the one or more first-cell-only rows including: within each of the one or more first-cell-only rows, inserting another instance of the first cell.

In an embodiment, a semiconductor device includes: cell regions arranged in rows which extend substantially in a first direction; one or more of the rows being combination rows, each combination row having: relative to a second direction substantially perpendicular to the first direction, a height substantially equal to a sum of a first height of a first cell region and a second height of a second cell region; the first cell region being different than the second cell region, and the first height being different than the second height; and each of the one or more combination rows including: relative to the second direction, a first instance of the first cell region stacked on a first instance of the second cell region; or relative to the second direction, a second instance of the second cell region stacked on a second instance of the first cell region. In an embodiment, the first cell region is a high power (HP) cell region and the second cell region is a low power (LP) cell region; or the first cell region is an LP cell region and the second cell is an HP cell region. In an embodiment, each of the one or more combination rows further includes: relative the second direction, a third instance of the first cell region stacked on a third instance of the second cell region which represents a 1st/2nd stack, and wherein the 1st/2nd stack is configured as an integral cell region; and relative the second direction, a fourth instance of the second cell region stacked on a fourth instance of the first cell region which represents a 2nd/1st stack, and wherein the 2nd/1st stack is configured as an integral cell region. In an embodiment, one or more rows are configured as first-cell-region only rows, each first-cell-region-only row having: relative to the second direction, a height substantially equal to the first height of the first cell region; the one or more first-cell-only rows being interspersed among the one or more combination rows; and each of the one or more first-cell-region only rows including at least another instance of the first cell. In an embodiment, one or more rows are configured as second-cell-region-only rows, each second-cell-region-only having: relative to the second direction, a height substantially equal to the second height of the second cell; the one or more second-cell-region-only rows being interspersed among the one or more combination rows and among the one or more first-cell-only rows; and each of the one or more second-cell-region only rows including at least another instance of the second cell. In an embodiment, one or more rows are configured as second-cell-region-only rows, each second-cell-region-only having: relative to the second direction, a height substantially equal to the second height of the second cell; the one or more second-cell-region-only rows being interspersed among the one or more combination rows; and each of the one or more second-cell-region only rows including at least another instance of the second cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, for a layout diagram stored on a non-transitory computer-readable medium, the method comprising generating the layout diagram including:
   arranging the layout diagram into rows which extend substantially in a first direction, the rows including a first row and a second row, the second row being adjacent to the first row in a second direction substantially perpendicular to the first direction;
   configuring one or more of the rows as combination rows, the combination-row-configuring including:
      configuring the second row as a combination row;
      relative to the second direction, setting a height of each of the one or more combination rows to be substantially equal to a sum of a first height of a first cell and a second height of a second cell, the first cell being different than the second cell, and the first height being different than the second height; and
   populating each of the one or more combination rows including:
      within the second row and relative to the second direction, stacking a first instance of the first cell on a first instance of the second cell such that the first instance of the first cell is between the first row and the first instance of the second cell; and
      within the second row and relative to the second direction, stacking a second instance of the second cell on a second instance of the first cell such that the second instance of the second cell is between the first row and the second instance of the first cell.

2. The method of claim 1, wherein the generating the layout diagram further includes:
   configuring each of the first and second cells including:
      generating an active area pattern extending in the first direction; and
      generating a gate pattern extending in the second direction and overlapping the active area pattern,
   the method further comprising, based on the layout diagram, at least one of:
      (A) making one or more photolithographic exposures;
      (B) fabricating one or more semiconductor masks; or
      (C) fabricating at least one component in a layer of a semiconductor integrated circuit.

3. The method of claim 1, wherein:
the first cell is a high power (HP) cell and the second cell is a low power (LP) cell; or
the first cell is an LP cell and the second cell is an HP cell.

4. The method of claim 1, wherein the populating further includes:
within at least one of the one or more combination rows and relative the second direction:
stacking a third instance of the first cell on a third instance of the second cell resulting in a 1st cell/2nd cell stack; and
configuring the 1st cell/2nd cell stack as an integral cell; or
within at least one of the one or more combination rows and relative the second direction:
stacking a fourth instance of the second cell on a fourth instance of the first cell resulting in a 2nd cell/1st cell stack; and
configuring the 2nd cell/1st cell stack as an integral cell.

5. The method of claim 1, the generating the layout diagram further includes:
configuring one or more rows as first-cell-only rows, the first-cell-only configuring including:
relative to the second direction, setting a height of each of the one or more first-cell-only rows to be substantially equal to the first height of the first cell;
relative to the second direction, interspersing the one or more first-cell-only rows among the one or more combination rows; and
populating each of the one or more first-cell-only rows including:
within each of the one or more first-cell-only rows, inserting another instance of the first cell.

6. The method of claim 5, the generating the layout diagram further includes:
configuring one or more rows as second-cell-only rows, the second-cell-only configuring including:
relative to the second direction, setting a height of each of the one or more second-cell-only rows to be substantially equal to the second height of the second cell;
interspersing the one or more second-cell-only rows among the one or more combination rows and among the one or more first-cell-only rows; and
populating each of the one or more second-cell-only rows including:
within each of the one or more second-cell-only rows, inserting at least another instance of the second cell.

7. The method of claim 1, the generating the layout diagram further includes:
configuring one or more rows as second-cell only rows, the second-cell-only configuring including:
relative to the second direction, setting a height of each of the one or more second-cell-only rows to be substantially equal to the second height of the second cell;
interspersing the one or more second-cell-only rows among the one or more combination rows; and
populating each of the one or more second-cell-only rows including:
within each of the one or more second-cell-only rows, inserting at least another instance of the second cell.

8. The method of claim 1, wherein the generating the layout diagram further includes:
configuring each of the first and second cells including:
generating conductive patterns for a first metallization level (M_1st level) and having corresponding long axes extending substantially in the first direction;
relative to the second direction, setting a first pitch as a sole pitch for the M_1st level, the first pitch being for conductive patterns;
generating conductive patterns for a second metallization level (M_2nd level);
generating conductive patterns for a third metallization level (M_3rd level) including conductive patterns for a power grid (PG patterns) and conductive patterns for control or data signals (logic patterns); and
relative to the second direction, setting multiple pitches for the M_3rd level, the multiple pitches including:
a second pitch for logic patterns; and
a third pitch for PG patterns, the third pitch being greater than the second pitch.

9. A method of manufacturing a semiconductor device, for a layout diagram stored on a non-transitory computer-readable medium, the method comprising generating the layout diagram including:
arranging the layout diagram into rows which extend substantially in a first direction; and
configuring first and second cells for the rows including:
generating conductive patterns for a first metallization level (M_1st level);
relative to a second direction substantially perpendicular to the first direction, setting a first pitch as a sole pitch for the M_1st level, the first pitch being for conductive patterns;
generating conductive patterns for a second metallization level (M_2nd level);
generating conductive patterns for a third metallization level (M_3rd level) including conductive patterns for a power grid (PG patterns) and conductive patterns for control or data signals (logic patterns); and
relative to the second direction, setting multiple pitches for the M_3rd level, the multiple pitches including:
a second pitch for logic patterns, the second pitch being different from the first pitch; and
a third pitch for PG patterns, the third pitch being greater than the second pitch.

10. The method of claim 9, further comprising:
based on the layout diagram, at least one of:
(A) making one or more photolithographic exposures;
(B) fabricating one or more semiconductor masks; or
(C) fabricating at least one component in a layer of a semiconductor integrated circuit.

11. The method of claim 9, wherein the rows include a first row and a second row, the second row being adjacent to the first row in the second direction,
the generating the layout diagram further includes:
configuring one or more of the rows as combination rows including:
configuring the second row as a combination row;
relative to the second direction, setting a height of each of the one or more combination rows to be substantially equal to a sum of a first height of a first cell and a second height of a second cell, the first cell being different than the second cell, and the first height being different than the second height; and
populating each of the one or more combination rows including:
within the second row and relative to the second direction, stacking a first instance of the first cell on a first instance of the second cell such that the first instance of the first cell is between the first row and the first instance of the second cell; and within the second row and relative to the second direction, stacking a second instance of the second cell on a second instance of the first cell such that the second instance of the second cell is between the first row and the second instance of the first cell.

12. The method of claim 11, wherein:

the first cell is a high power (HP) cell and the second cell is a low power (LP) cell; or the first cell is an LP cell and the second cell is an HP cell.

13. The method of claim 11, wherein the populating further includes:

within at least one of the one or more combination rows and relative the second direction:
stacking a third instance of the first cell on a third instance of the second cell resulting in a 1st cell/2nd cell stack; and
configuring the 1st cell/2nd cell stack as an integral cell; or within at least one of the one or more combination rows and relative the second direction:
stacking a fourth instance of the second cell on a fourth instance of the first cell resulting in a 2nd cell/1st cell stack; and
configuring the 2nd cell/1st cell stack as an integral cell.

14. The method of claim 13, wherein the generating the layout diagram further includes:

configuring one or more rows as first-cell-only rows, the first-cell-only configuring including:
relative to the second direction, setting a height of each of the one or more first-cell-only rows to be substantially equal to the first height of the first cell;
relative to the second direction, interspersing the one or more first-cell-only rows among the one or more combination rows; and
populating each of the one or more first-cell-only rows including:
within each of the one or more first-cell-only rows, inserting another instance of the first cell.

15. A semiconductor device comprising:

cell regions arranged in rows which extend substantially in a first direction, the rows including a first row and a second row,
the second row being adjacent to the first row in a second direction substantially perpendicular to the first direction; and
the second row being a combination row having:
relative to the second direction, a height substantially equal to a sum of a first height of a first cell region and a second height of a second cell region, the first cell region being different than the second cell region, and the first height being different than the second height;
relative to the second direction, a first instance of the first cell region stacked on a first instance of the second cell region such that the first instance of the first cell region is between the first row and the first instance of the second cell region; and
relative to the second direction, a second instance of the second cell region stacked on a second instance of the first cell region such that the second instance of the second cell region is between the first row and the second instance of the first cell region.

16. The semiconductor device of claim 15, wherein:

the first cell region is a high power (HP) cell region and the second cell region is a low power (LP) cell region; or the first cell region is an LP cell region and the second cell region is an HP cell region.

17. The semiconductor device of claim 15, wherein the rows further include one or more additional combination rows including:

relative the second direction, a third instance of the first cell region stacked on a third instance of the second cell region which represents a 1st cell/2nd cell stack, and wherein the 1st cell/2nd cell stack is configured as an integral cell region; and relative the second direction, a fourth instance of the second cell region stacked on a fourth instance of the first cell region which represents a 2nd cell/1st cell stack, and wherein the 2nd cell/1st cell stack is configured as an integral cell region.

18. The semiconductor device of claim 15, wherein:

one or more rows are configured as first-cell-region only rows, each first-cell-region-only row having:
relative to the second direction, a height substantially equal to the first height of the first cell region;
the one or more first-cell-region-only rows being interspersed among the one or more combination rows; and
each of the one or more first-cell-region-only rows including at least another instance of the first cell.

19. The semiconductor device of claim 18, wherein:

one or more rows are configured as second-cell-region-only rows, each second-cell-region-only row having:
relative to the second direction, a height substantially equal to the second height of the second cell region;
the one or more second-cell-region-only rows being interspersed among the one or more combination rows and among the one or more first-cell-region-only rows; and
each of the one or more second-cell-region-only rows including at least another instance of the second cell region.

20. The semiconductor device of claim 15, wherein:

one or more rows are configured as second-cell-region-only rows, each second-cell-region-only row having:
relative to the second direction, a height substantially equal to the second height of the second cell region;
the one or more second-cell-region-only rows being interspersed among the one or more combination rows; and
each of the one or more second-cell-region-only rows including at least another instance of the second cell region.

* * * * *